(12) United States Patent
Kawasaki et al.

(10) Patent No.: US 6,812,768 B2
(45) Date of Patent: Nov. 2, 2004

(54) INPUT CIRCUIT, DISPLAY DEVICE AND INFORMATION DISPLAY APPARATUS

(75) Inventors: Somei Kawasaki, Saitama (JP); Fujio Kawano, Kanagawa (JP); Masami Iseki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/650,740

(22) Filed: Aug. 29, 2003

(65) Prior Publication Data

US 2004/0104748 A1 Jun. 3, 2004

(30) Foreign Application Priority Data

Sep. 2, 2002 (JP) ........................................ 2002-256433
Aug. 28, 2003 (JP) ........................................ 2003-305079

(51) Int. Cl.[7] .............................................. H03L 5/00
(52) U.S. Cl. .......................... 327/333; 327/108; 326/68
(58) Field of Search ................................. 327/333, 108, 327/427, 112; 316/68, 81; 345/76, 80, 92; 315/169.3

(56) References Cited

U.S. PATENT DOCUMENTS 5,675,278 A * 10/1997 Tanaka et al. .............. 327/333

6,373,454 B1    4/2002 Knapp et al. ................. 345/76
6,737,813 B2 *  5/2004 Kawasaki et al. ............ 345/76

FOREIGN PATENT DOCUMENTS

JP          10-74060         3/1998

* cited by examiner

Primary Examiner—Long Nguyen
(74) Attorney, Agent, or Firm—Fitzpatrick, Cella, Harper & Scinto

(57) ABSTRACT

A first current mirror circuit performs its normal operation when a first switch is turned on, and is constructed so that a period during which the first current mirror circuit can output a current is realized when the first switch is turned off. A second current mirror circuit is connected to the first current mirror circuit so that the output current of the first current mirror circuit is decreased by an output current of the second current mirror circuit. A current output of a transistor and a current output of the first current mirror circuit are connected and outputted as an output signal. The first switch and a second switch are controlled by the output signal or a signal formed by the output signal being passed through a buffer circuit.

10 Claims, 20 Drawing Sheets

Fig. 8
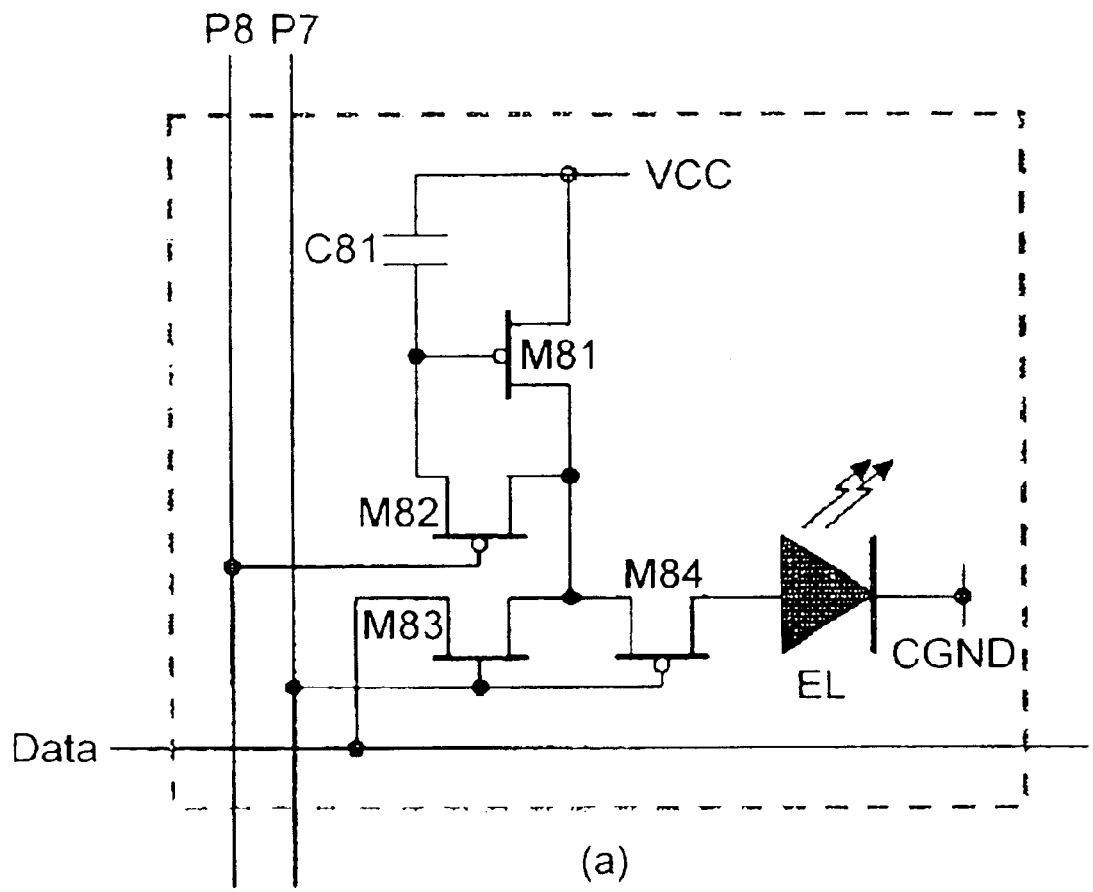
(a)
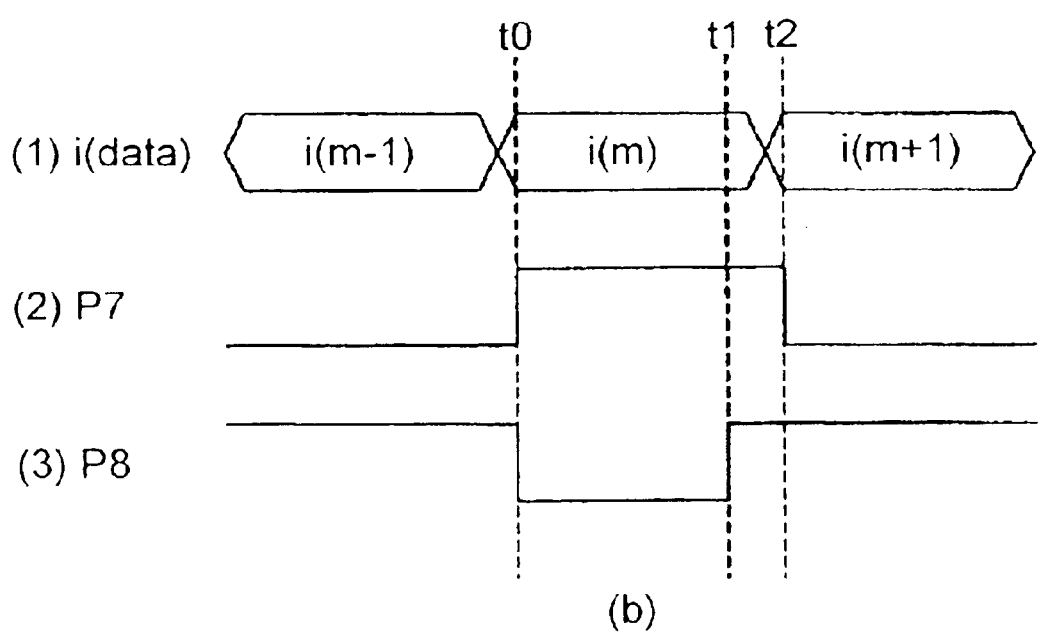
(b)

Fig. 9
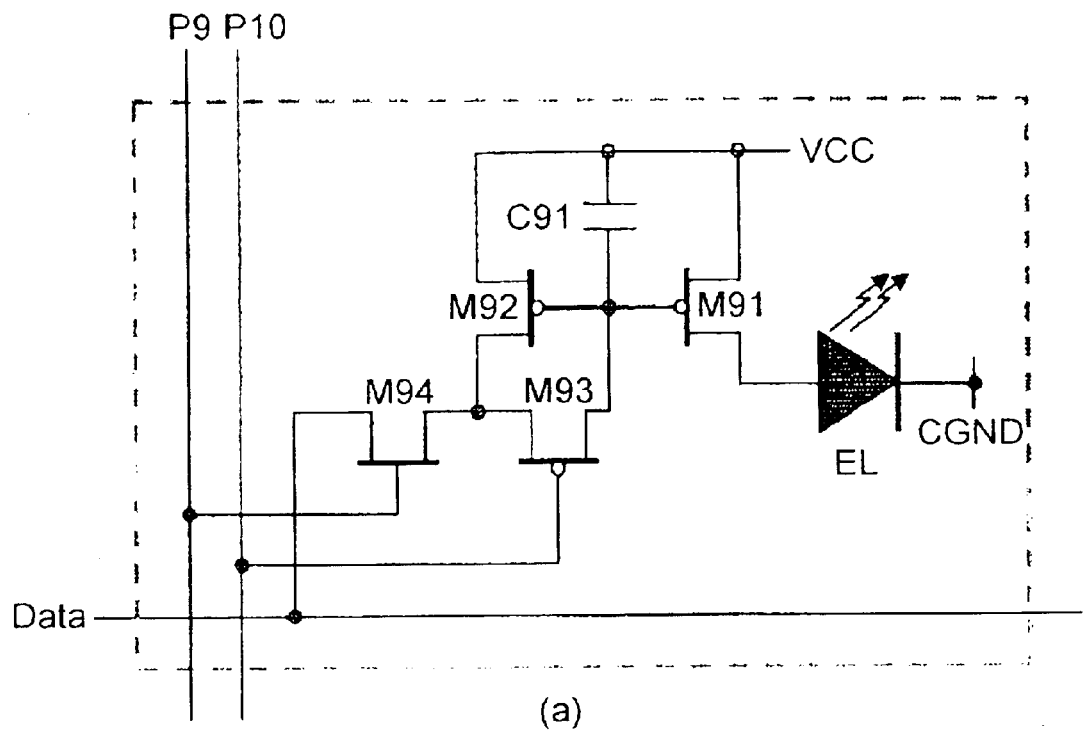
(a)
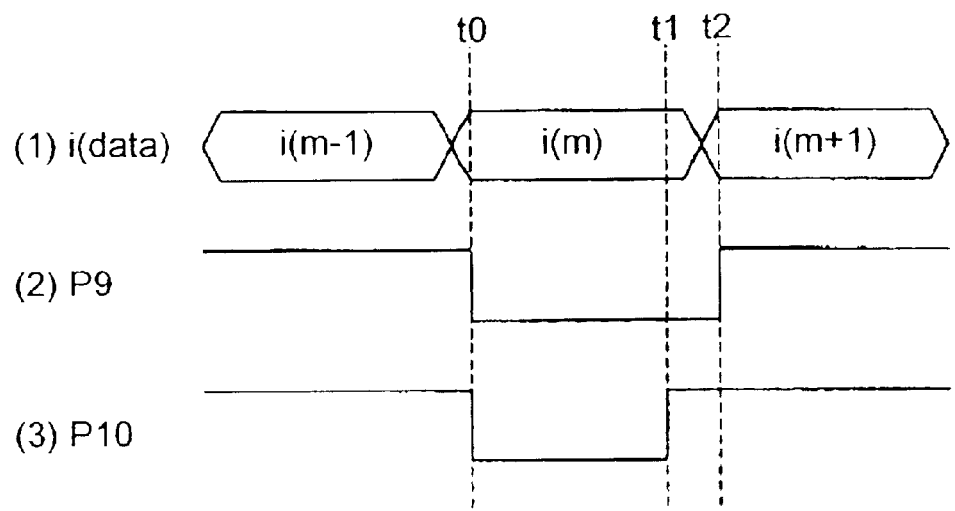
(b)

Fig. 12
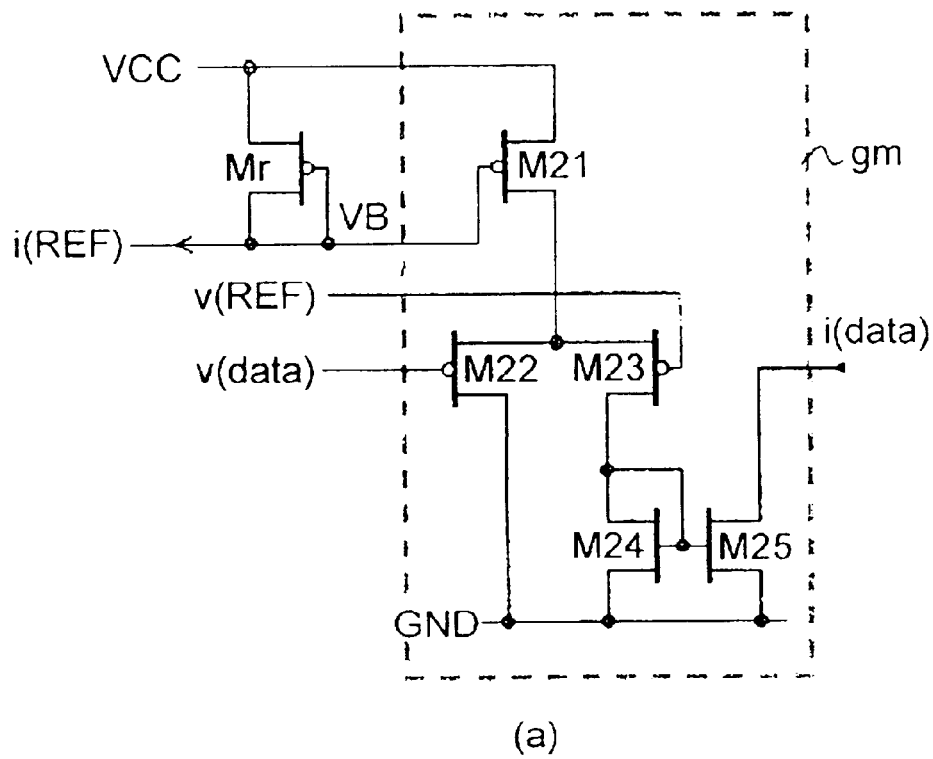
(a)
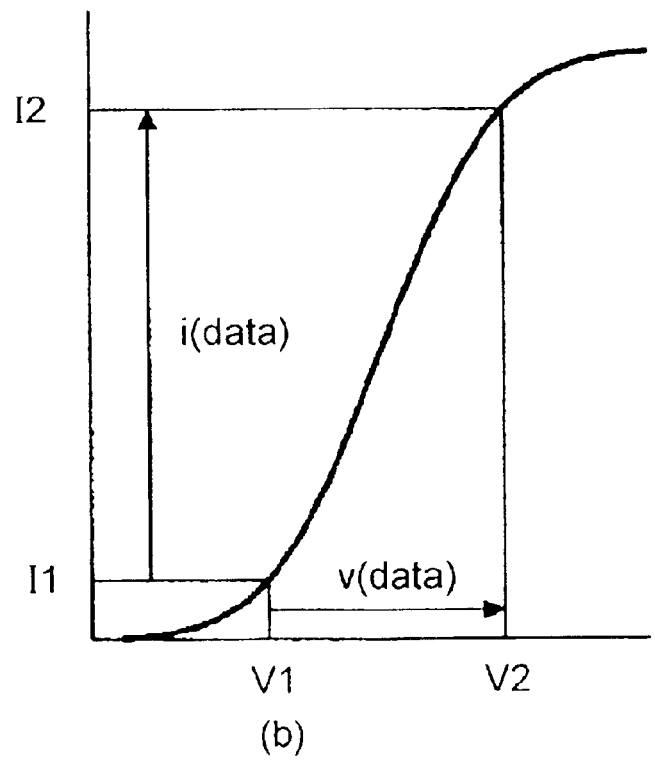
(b)

Fig. 13
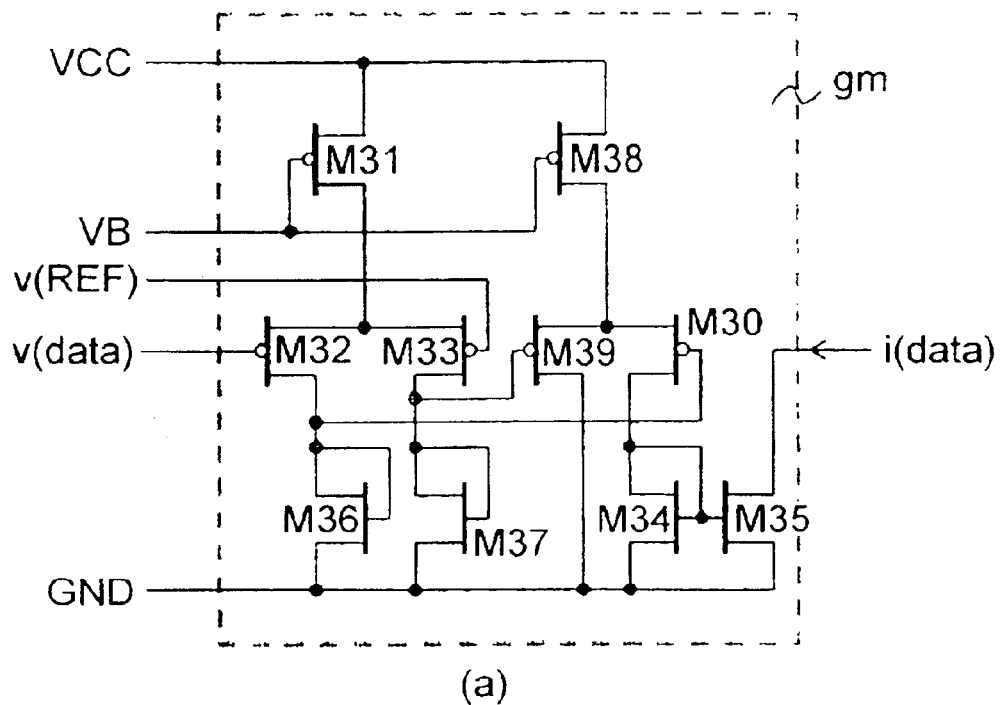
(a)
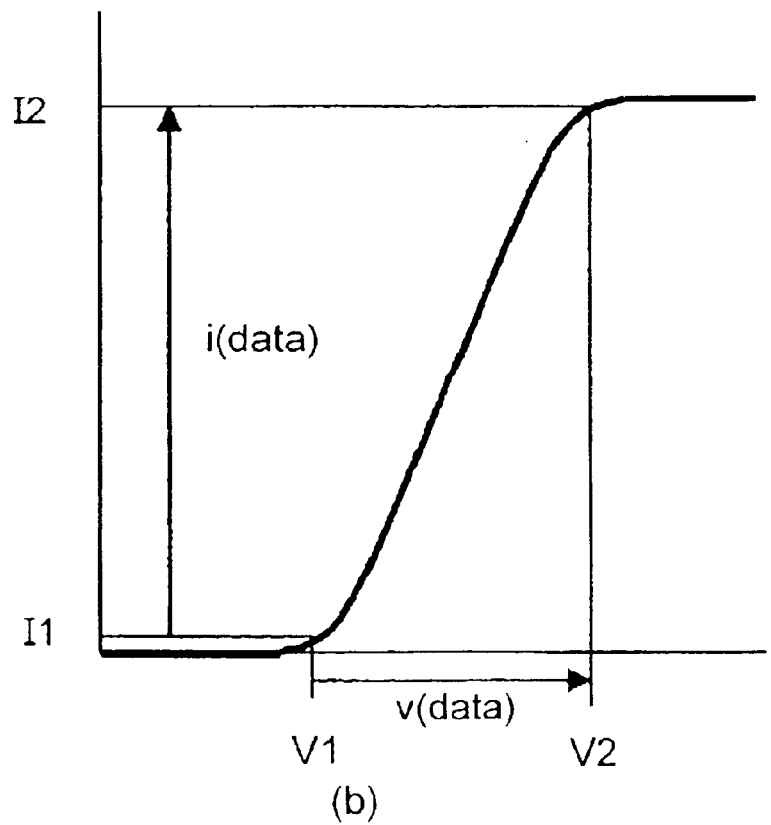
(b)

US 6,812,768 B2

INPUT CIRCUIT, DISPLAY DEVICE AND INFORMATION DISPLAY APPARATUS

BACKGROUND OF THE INVENTION

1. Field of the Invention

The present invention relates to an input circuit which converts a signal. The invention also relates to a display device and an information display apparatus each of which uses such an input circuit. More specifically, the invention relates to an input circuit which is necessary when the output signal of a large-scale integrated circuit (LSI) of low-voltage amplitude is inputted to a thin film transistor (TFT) circuit which operates at a high voltage.

2. Description of the Related Art

As a device which displays an input video signal on a two-dimensional plane, there is a display panel, such as a liquid crystal panel or an EL panel, which needs an input circuit for converting an input signal level into a high signal level.

The input circuit used in such a display panel needs to be of the type which converts a signal level, for example, from 5 V to 10 V, in a case where the output signal of an LSI is inputted to a TFT circuit. In particular, a small-sized display panel of the type which is used in a mobile device is desired to have a power saving feature, and is required to use an input circuit of low power consumption. In addition, the input circuit used in the display panel needs to operate in response to a horizontal scanning clock for generating sampling pulses for acquiring an input video signal, and therefore, needs to perform a highest-speed operation.

FIG. 4 shows a related-art input circuit. This input circuit receives, at its input, signals which are inverted with respect to each other and outputted from an LSI circuit which operates at a source voltage VCC2 of approximately 5 V. The input circuit converts the input signals into a signal of a level operable at a source voltage VCC1 of approximately 10 V, and outputs an output signal.

A positive input signal Pi is inputted to a gate of a transistor M100 whose source is connected to ground potential GND, while a negative input signal Ni is inputted to a gate of a transistor M400 whose source is connected to ground potential GND. The drain M100/D (drain of the transistor M100) is connected to a transistor M200 which has a source connected to the source voltage VCC1 and has a gate and a drain shorted together. The gate M200/G is connected to a gate of a transistor M300 whose source is connected to the source voltage VCC1. The drain M300/D and the drain M400/D are connected to each other at an output signal terminal Po. Incidentally, for the convenience of explanation in the present specification, the gate electrode, the source electrode and the drain electrode of each transistor are respectively denoted by shortened symbols /G, /S and /D.

FIG. 5 is a time chart for explanation of the operation of the input circuit shown in FIG. 4. The input signals Pi and Ni are signals which are inverted with respect to each other and outputted from the LSI, and are like a signal (a) whose level transition time is short on a time axis to be described below.

Before time t1, since the signal Pi is at its L level (the signal Ni is at its H level), the transistor M100 is off, the transistor M300 is off, and the transistor M400 is on, so that the output signal terminal Po is at its L level.

At time t1, when the signal Pi goes to its H level (the signal Ni goes to its L level), the transistor M100 is turned on, and the transistor M400 is turned off, so that an M200/G voltage (a gate voltage of the transistor M200) decreases and the transistor M300 starts current driving. Therefore, as shown in (b), the Po voltage starts increasing and reaches the voltage VCC1 at time t2, so that the current driving capability of the transistor M300 disappears.

At time t3, when the signal Pi again goes to the L level (the signal Ni goes to the H level), the transistor M100 is turned off and the transistor M400 is turned on, so that the M200/G voltage increases by self-discharge and the transistor M300 loses its current driving capability. Therefore, as shown in (b), the Po voltage starts decreasing and reaches ground potential GND at time t4, so that the current driving capability of the transistor M400 disappears.

During the period from time t1 to time t3 during which the signal Pi is at the H level, since the transistor M100 decreases the M200/G voltage, current driving continues.

During a period following time t3 at which the signal Pi is at the L level, only the transistor M400 generates current only during the period from time t3 to time t4.

FIG. 6 shows a construction example in which a circuit for converting one input signal into signals which are inverted with respect to each other is provided in the construction shown in FIG. 4.

U.S. Pat. No. 6,373,454 discloses an EL display.

SUMMARY OF THE INVENTION

It is necessary to note that current consumption is influenced by an input level and the source voltage VCC1 pulsatively varies owing to power-source interconnection resistance.

In the above-described input circuit, if the M200/G voltage is decreased to a low voltage as rapidly as possible, the current driving capability of the transistor M300 can be increased, so that the upward transition period (from time t1 to time t2) of the Po voltage can be shortened and the input waveforms of signals which are inverted with respect to each other can be more faithfully reflected onto the output signal. However, as the amount of driving current to be generated by the transistor M100 is increased, the current consumption from time t1 to time t3 increases. Therefore, since the current driving capability of the transistor MICO cannot be increased, the upward transition period (from time t1 to time t2) of the Po voltage cannot be shortened, like in (b). Particularly in a TFT circuit whose transistors are poor in current driving capability, the upward transition period (from time t1 to time t2) of the Po voltage increases to a further extent like in (c).

In addition, it is necessary to note non-uniformity in current driving capability among individual transistors. Namely, particularly in a TFT, the non-uniformity of threshold voltages Vth of individual transistors tends to become large, so that the threshold voltages Vth of the transistors M200 and M300 may differ. In this case, during the period following time t4, the gate-to-source voltage Vgs of the transistor M300 differs from Vth, so that a leak current occurs in the transistor M300.

Therefore, the related-art input circuits shown in FIGS. 4 and 6 have the following problems.

First, the related-art input circuits are incapable of shortening the level transition time of the output signal, so that the input circuits deform the waveforms, such as the duty ratios, of the input signals which are inverted with respect to each other and cannot cope with higher-speed operations. In addition, this problem will become conspicuous as a result of variations in the current driving capabilities of the transistors used, which variations are caused by source voltage variations and temperature variations of the transistors.

In addition, the related-art input circuits in either of which current is steadily consumed by the level of an input signal cannot be easily used in a system which is required to have a power saving feature.

According to a first aspect of the invention, an input circuit which receives first and second signals at its input and outputs an output signal having a level difference different from the first and second signals, at least includes:

a first transistor whose output current is controlled by the level of the first signal;

second and third transistors whose output currents are controlled by the level of the second signal;

a first current mirror circuit which receives a current output of the first transistor at its input and includes a first switch;

a second switch which receives a current output of the second transistor at its input; and a second current mirror circuit which receives an output of the second switch at its input.

The first current mirror circuit performs its normal operation when the first switch is turned on, and is constructed so that a period during which the first current mirror circuit can output a current is realized when the first switch is turned off;

the second current mirror circuit is connected to the first current mirror circuit so that the output current of the first. current mirror circuit is decreased by an output current of the second current mirror circuit;

a current output of the third transistor and a current output of the first current mirror circuit are connected and outputted as an output signal; and the first and second switches are controlled by the output signal or a signal formed by the output signal being passed through a buffer circuit.

Preferably, the first current mirror circuit performs its normal operation when the first switch is turned on, and is constructed so that the period during which the first current mirror circuit can output a large amount of current is realized when the first switch is turned off.

According to a second aspect of the invention, the input circuit according to the first aspect of the invention further includes a conversion circuit for converting the level of the first signal and has a construction in which the output current of the first transistor is controlled by a signal obtained by converting the level of the first signal.

According to a third aspect of the invention, the input circuit according to the first or second aspect of the invention further includes a conversion circuit for converting the level of the second signal and has a construction in which the output currents of the second and third transistors are controlled by a signal obtained by converting the level of the second signal.

According to a fourth aspect of the invention, the input circuit according to any of the first to third aspects of the invention is constructed so that the second signal is connected to one of two electrodes of the first transistor except for a gate electrode thereof, the one being an electrode different from an electrode through which the current output is outputted.

According to a fifth aspect of the invention, the input circuit according to any of the first to fourth aspects of the invention is constructed so that the first signal is connected to one of two electrodes of the second transistor except for a gate electrode thereof, the one being an electrode different from an electrode through which the current output is outputted.

According to a sixth aspect of the invention, the input circuit according to any of the first to fifth aspects of the invention is constructed so that the first signal is connected to one of two electrodes of the third transistor except for a gate electrode thereof, the one being an electrode different from an electrode through which the current output is outputted.

An operation-enable level need only to be given to one of the two electrodes of each of the first, second and third transistors other than the gate electrode thereof, the one electrode being the electrode which is not the electrode through which the output current is outputted, and it is preferable to construct the input circuit in the above-described manner. The invention is particularly useful in the case where a source-follower circuit is used as the circuit for converting the level of the first or second signal.

According to a seventh aspect of the invention, in the case where the input circuit receives one signal at its input, the input circuit is preferably constructed to further include a circuit for generating the first signal and the second signal from the one signal.

According to an eighth aspect of the invention, in the input circuit according to any of the first to seventh aspects of the invention, the first signal and the second signal are signals which are inverted with respect to each other.

The invention also encompasses a display device which includes an input circuit for converting an input signal according to any of the first to eight aspects of the invention, and a display element driven by a signal supplied from the input circuit. The invention also encompasses an information display apparatus which includes an information input part to which information is to be inputted, and the display device which provides visual display according to the information inputted to the information input part.

BRIEF DESCRIPTION OF THE DRAWINGS

The invention will become more readily appreciated and understood from the following detailed description of the preferred embodiments of the invention when taken in conjunction with the accompanying drawings, in which:

FIG. 8(a) is a circuit diagram for explanation of a pixel circuit using the current setting method;

FIG. 8(b) is a time chart for explanation of the operation of the pixel circuit shown in FIG. 8(a);

FIG. 9(a) is a circuit diagram for explanation of another pixel circuit using the current setting method;

FIG. 9(b) is a time chart for explanation of the operation of the pixel circuit shown in FIG. 9(a);

FIG. 12(a) is a circuit diagram for explanation of a voltage-current conversion circuit used in the EL element driving control circuit shown in FIG. 10;

FIG. 12(b) is a view showing the voltage-current conversion characteristic of the circuit shown in FIG. 12(a);

FIG. 13(a) is a circuit diagram for explanation of another voltage-current conversion circuit for use in the EL element driving control circuit shown in FIG. 10;

FIG. 13(b) is a view showing the voltage-current conversion characteristic of the circuit shown in FIG. 13(a);

DESCRIPTION OF THE PREFERRED EMBODIMENTS

An input circuit according to the invention will be specifically described below with reference to one embodiment shown in FIG. 1, but the invention is not limited to only this embodiment. For example, the form of connection shown in FIG. 1 is merely one example, and may be adequately modified according to various cases such as the case where the relationship in potential between ground potential GND and a source voltage VCC1 or VCC2 or the channel characteristics of individual transistors is inverted.

Figure 1:
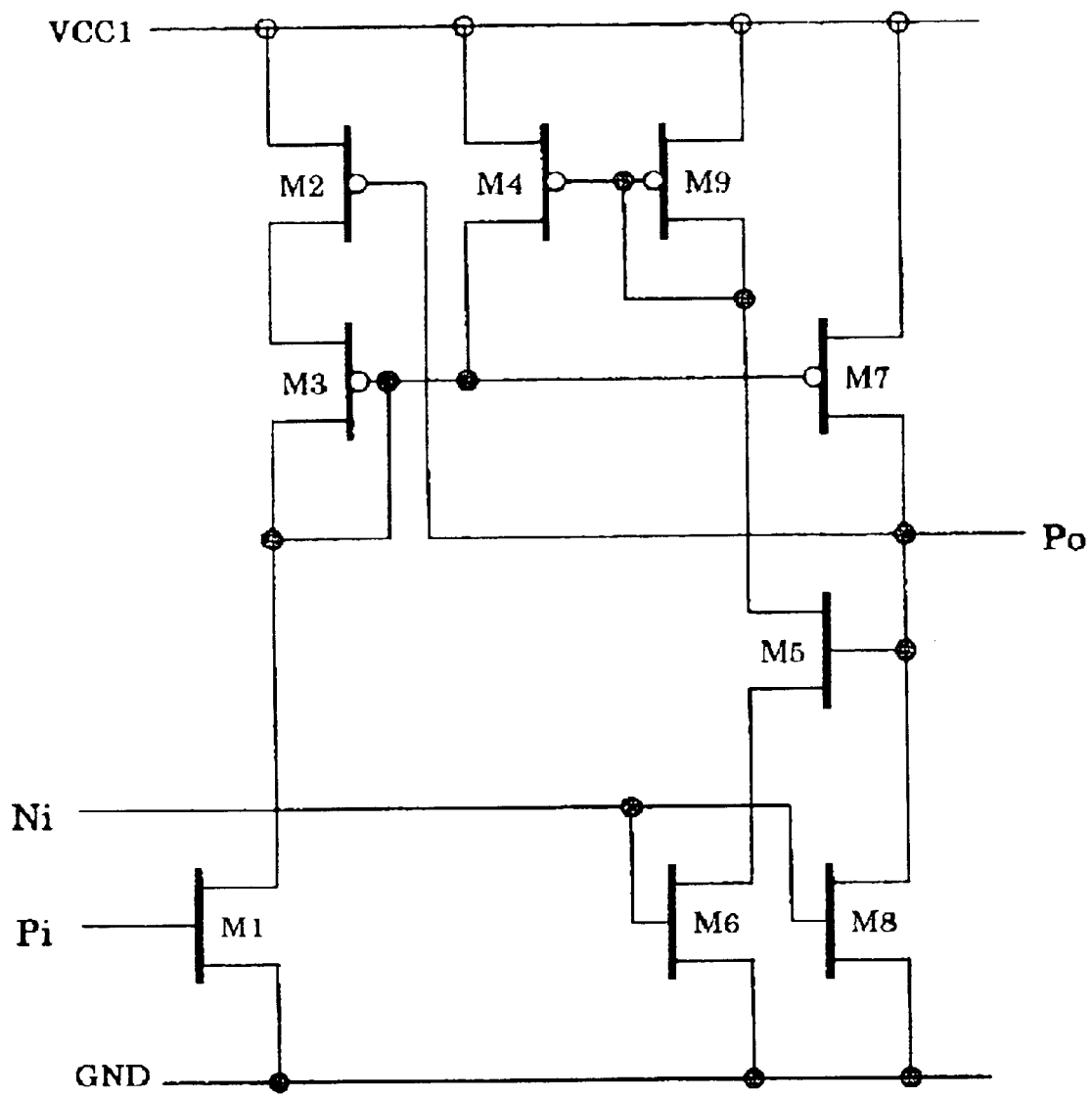
FIG. 1 is a circuit diagram showing an embodiment of an input circuit according to the invention.

In FIG. 1, each transistor denoted by Mi (i is a natural number) may be not only a TFT transistor but also an insulated-gate field effect transistor fabricated from single-crystalline silicone.

Figure 4:
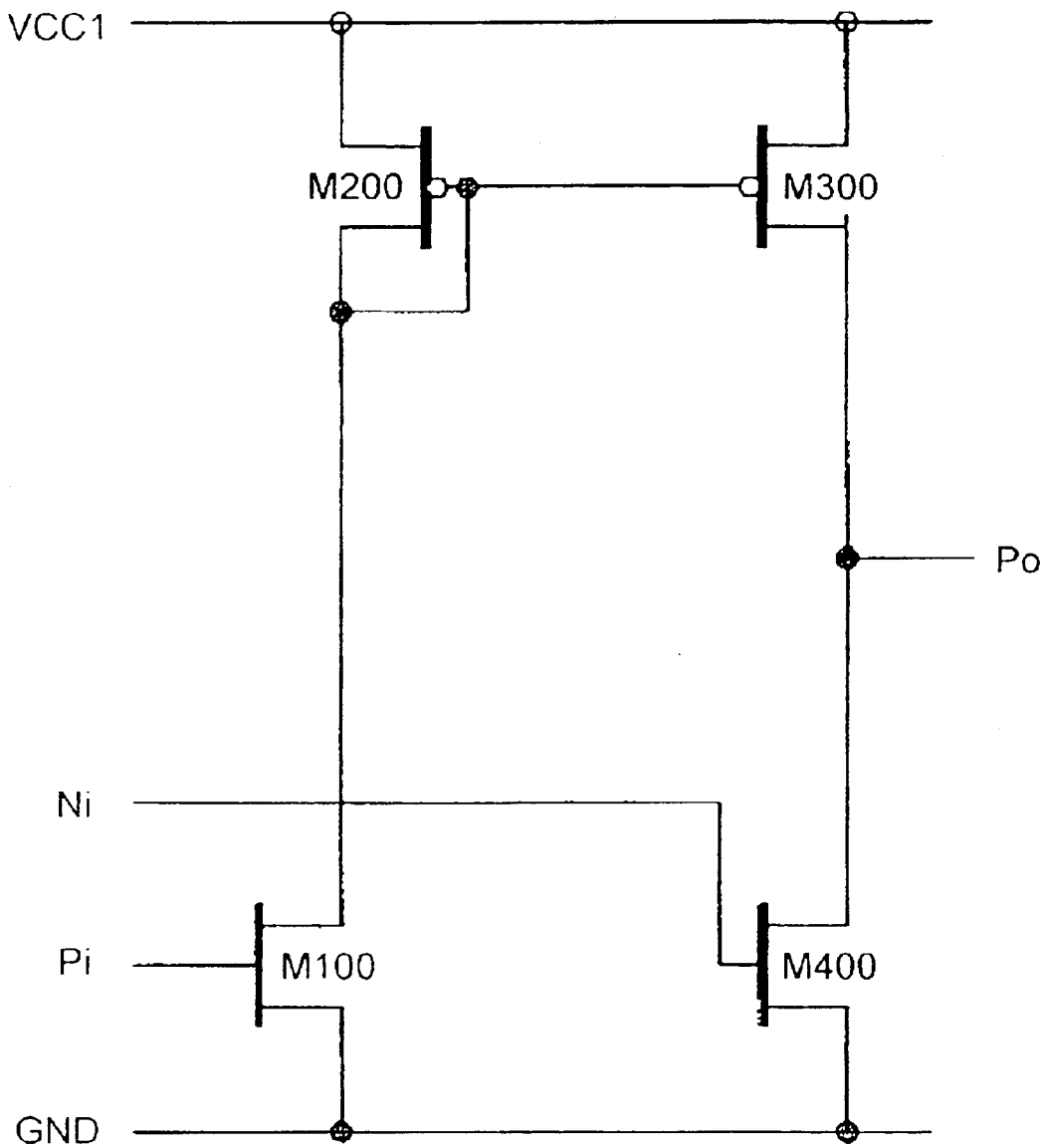
FIG. 4 is a circuit diagram of a related-art input circuit.

Similarly to the input circuit shown in FIG. 4, the input circuit shown in FIG. 1 receives as its input signals a first signal Pi and a second signal Ni, which are signals which are inverted with respect to each other and have an amplitude level equal to the low voltage VCC2, and outputs an output signal Po having an amplitude level equal to the high voltage VCC1.

As shown in FIG. 1, the input circuit at least includes a first transistor (M1) whose output current is controlled by the level of the first signal (Pi), second and third transistors (M6 and M8) whose output currents are controlled by the level of the second signal (Ni), a first current mirror circuit (formed by transistors M2, M3 and M7) which receives at its input the current output from the first transistor M1 and includes a first switch (M2), a second switch (M5) which receives at its input the current output from the second transistor (M6), and a second current mirror circuit (formed by transistors M4 and M9) which receives at its input the current output from the second switch M5. In the second current mirror circuit formed by the transistors M4 and M9, the current-output-side transistor M4 is connected to the line between the gate electrodes of the transistors M3 and M7 which form the first current mirror circuit, so that the current output from the first current mirror circuit formed by the transistors M3 and M7 can be decreased by the current output from the second current mirror circuit formed by the transistors M4 and M9. The current output from the third transistor M8 and the current output from the first current mirror circuit formed by the transistors M3 and M7 are added together at an output signal terminal Po, from which the output signal Po is outputted. The first and second switches M2 and M5 are connected to the output signal terminal Po.

As will be apparent from a later description of the operation of the input circuit, in the form of connection shown in FIG. 1 by way of example, the first switch M2 is inserted between the reference-current-side transistor M3 of the first current mirror circuit and the source voltage VCC1, whereby the first current mirror circuit performs its normal operation when the first switch M2 is on, and when the first switch M2 is off, it is possible to realize the period during which the first current mirror circuit can output a large amount of current.

In connection with the case where the channel characteristics of the individual transistors are specified in such a manner that the transistor M1 has n channel characteristics and the transistor M2 has p channel characteristics as shown in FIG. 1, the construction and the operation of the input circuit according to the invention will be described below more specifically, and in addition, the effect and advantage of the invention will be described below.

The input signal Pi is applied to the gate M1/G of the transistor M3 whose source is connected to ground potential GND. The drain M1/D is connected to the drain M3/D of the transistor M3 whose drain and gate are shorted together. The gate M3/G is connected to the gate M7/G of the transistor M7 whose source is connected to the source voltage VCC1. The source M3/S is connected to the drain M2/D of the transistor M2 whose source is connected to the source voltage VCC1, and the gate M2/G is connected to the drain M7/D.

In the meantime, the input signal Ni is applied to gates M6/G and M8/G of the transistors M6 and M8 whose respective sources are connected to ground potential GND. The drain M6/D is connected to the source M5/S. The gate M5/G is connected to the drain M7/D. The drain M5/D is connected to the drain M9/D of the transistor M9 whose source is connected to the source voltage VCC1 and whose gate and drain are shorted together. The gate M9/G is connected to the gate M4/G of the transistor M4 whose source is connected to the source voltage VCC1. The gate M4/D is connected to the gate M7/G. The drain M8/D is connected to the drain M7/D and forms the output signal terminal Po, from which the output signal Po is outputted.

Figure 2:
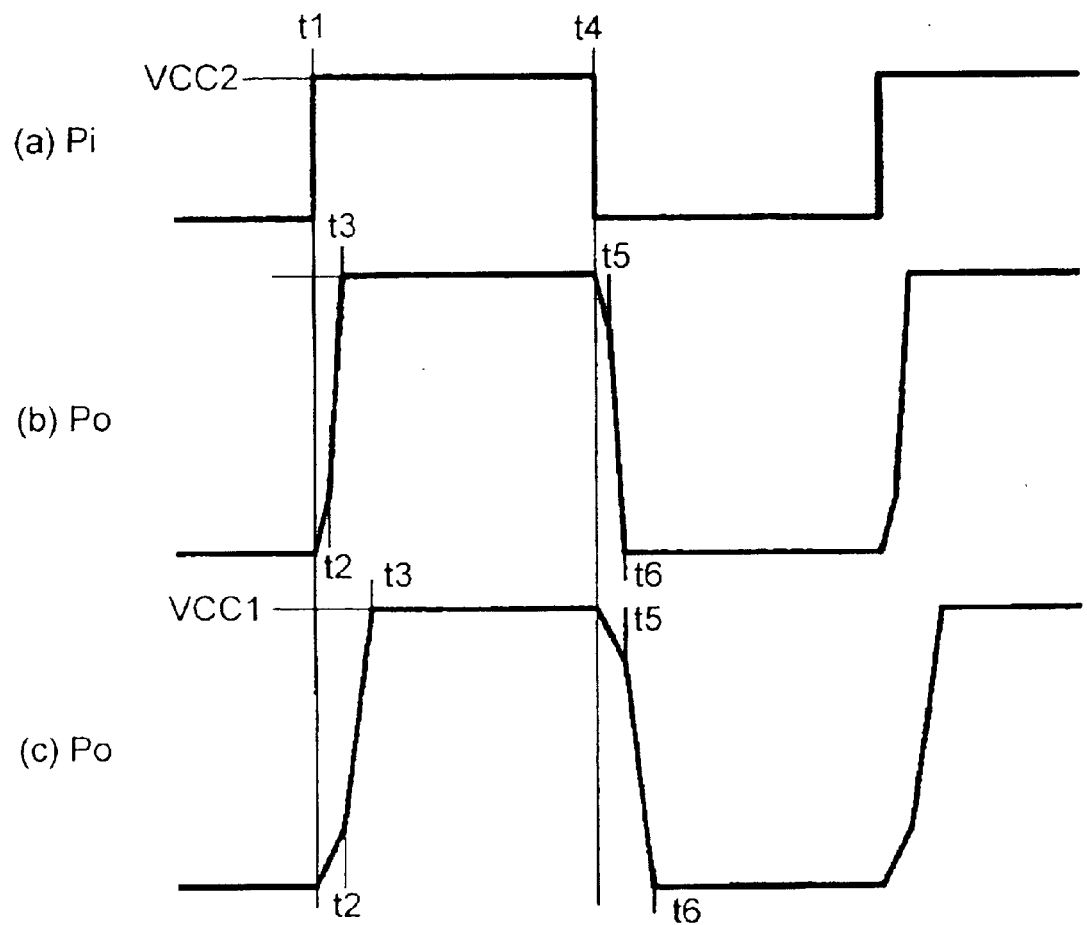
FIG. 2 is a time chart for explanation of the operation of the input circuit shown in FIG. 1.

FIG. 2 is a time chart for explanation of the operation of the input circuit shown in FIG. 1.

Before Time t1

Since the input signal Pi (Ni) is at its L (H) level, the transistor M1 is off and the transistors M6 and M8 are on.

If it is assumed here that the output signal Po is at its L level, the transistor M2 is on and the transistor M5 is off, so that the gate M7/G is raised to the source voltage VCC1 by the current mirror circuit formed by the transistors M9 and M4 and the transistor M7 is turned off. Accordingly, the L level of the output signal Po is established.

Then, if it is assumed that the output signal Po is at its H level, the transistor M5 is on, and the gate M7/G is raised to the source voltage VCC1 by the current mirror circuit formed by the transistors M9 and M4 and the transistor M7 is turned off. Accordingly, the voltage of the output signal Po sharply changes from the H (VCC1) level to the L (GND) level, and is established at the L (GND) level.

Accordingly, when the input signal Pi is at the L level, the output signal Po is always at the L level. In addition, the voltage Vds between the drain and the source of each of the transistors M2, M6 and M8 which are on when the output signal Po is at the L level disappears, so that the transistors M2, M6 and M8 completely lose their current driving capabilities.

Even if there is a difference between the thresholds Vth of the transistors M4 and M9 of the current mirror circuit and the transistor M4 is in its current driving state, the drain M4/D goes to the level of the source voltage VCC1, so that the transistor M4 loses its current driving capability. At this time, in the current mirror circuit formed by the transistors M3 and M7, the current driving capability of the transistor M7 is minute. This is because even if a threshold voltage error ΔVth is large like in a TFT circuit and the thresholds Vth of the transistors M3 and M7 differ by a small degree, approximately 100 nA needs only to be estimated as an M7/D current (although the M7/D current depends on the size of the transistor).

Accordingly, when the input signal Pi is at the L level, if the source voltage VCC1 is 10 V in the input circuit shown in FIG. 1, power consumption due to the M7/D current is negligibly small at about as low as 1 μW.

From Time t1 to Time t4

Since the input signal Pi changes to the H level at time t1, the transistor M1 changes to its on level and the transistors M6 and M8 change to their off levels, so that the output signal Po becomes unable to be held at the L level. At this time, since the output signal Po is at the L level, the transistor M2 is on and the driving current of the transistor M1 is supplied to the transistor M3, and the voltage of the gate M3/G decreases and the transistor M7 starts current driving. Although the voltage decrease of the gate M3/G is not rapid, the voltage of the output signal Po increases.

Since the voltage increase of the output signal Po decreases the current driving capability of the transistor M2, the M2/D voltage decreases. Accordingly, a position feedback operation takes place in which the M3/G voltage also decreases and the current driving capability of the transistor M7 increases and the voltage of the output signal Po increases to a further extent. Accordingly, the transistor M2 loses the current driving capability and the drain M3/D (or the gate M3/G) rapidly changes to the L (or GND) level At this time t2, since the transistor M7 gains its maximum current driving capability, the voltage of the output signal Po increases at its maximum speed, and is established at the H (VCC1) level at time t3. This state continues until time t4 until which the input signal Pi is at the H level. In this manner, the first current mirror circuit formed by the transistors M2, M3 and M7 can realize the period (from time t2 to time t3) during which the first current mirror circuit can output a large amount of current when the first switch M2 is turned off.

During the period from time t3 to time t4, since the transistor M6 is off and no current flows to the transistor M5, an M4/D current is a minute current in the current mirror circuit formed by the transistors M4 and M9. This is because even if the threshold voltage error ΔVth is large like in a TFT circuit, approximately 100 nA needs only to be estimated as the M4/D current (although the M4/D current depends on the size of the transistor). Namely, if the source voltage VCC1 is 10 V, power consumption due to the M4/D current is negligibly small at about as low as 1 μW. (In addition, during this period, since the transistor M2 is off, unlike the related art shown in FIG. 4, a current does not flow in a reference-current-side path (in this embodiment, an M1-side path) of the current mirror circuit (in the invention, the first current mirror circuit) whose output current is the output signal Po, whereby a decrease in power consumption is realized.)

From Time t4 to Time t6

At time t4, since the input signal Pi again changes to the L level, the transistor M1 is turned off, and the transistors M6 and M8 are turned on. At this time, since the output signal Po is at the, H level, the transistor M2 remains off, but the transistor M5 is on and the voltage of the gate M9/G (the drain M9/D) decreases. The transistor M4 goes to the current driving state, and the transistor M7 loses the current driving capability and the voltage of the output signal Po (the gate M2/G) starts to decrease.

At time t5, the transistor M2 is also turned on to increase an M7/G voltage, and the transistor M7 loses the current driving capability to a further extent. When the output signal Po goes to the L (GND) level, the transistor M8 loses the voltage Vds of itself and loses the current driving capability, and since the transistor M5 is turned off, the transistor M6 loses the voltage Vds of itself and loses the current driving capability. Then, the transistor M4 of the current mirror circuit formed by the transistors M4 and M9 also loses the current driving capability or the current driving capability of the transistor M4 goes to an extremely minute state.

Since the transistor M8 performs current driving during only the period from time t4 to time t6, the gate width W of the transistor M8 may be enlarged to increase the current driving capability so that the transition time from t4 to t6 can be reduced.

In to above-described operation of the input circuit shown in FIG. 1, the transistors M2 and M5, each of which performs a switching operation, are not limited to being controlled by the output signal Po, and may also be controlled by a signal formed by the output signal Po being passed through a buffer circuit.

Figure 5:
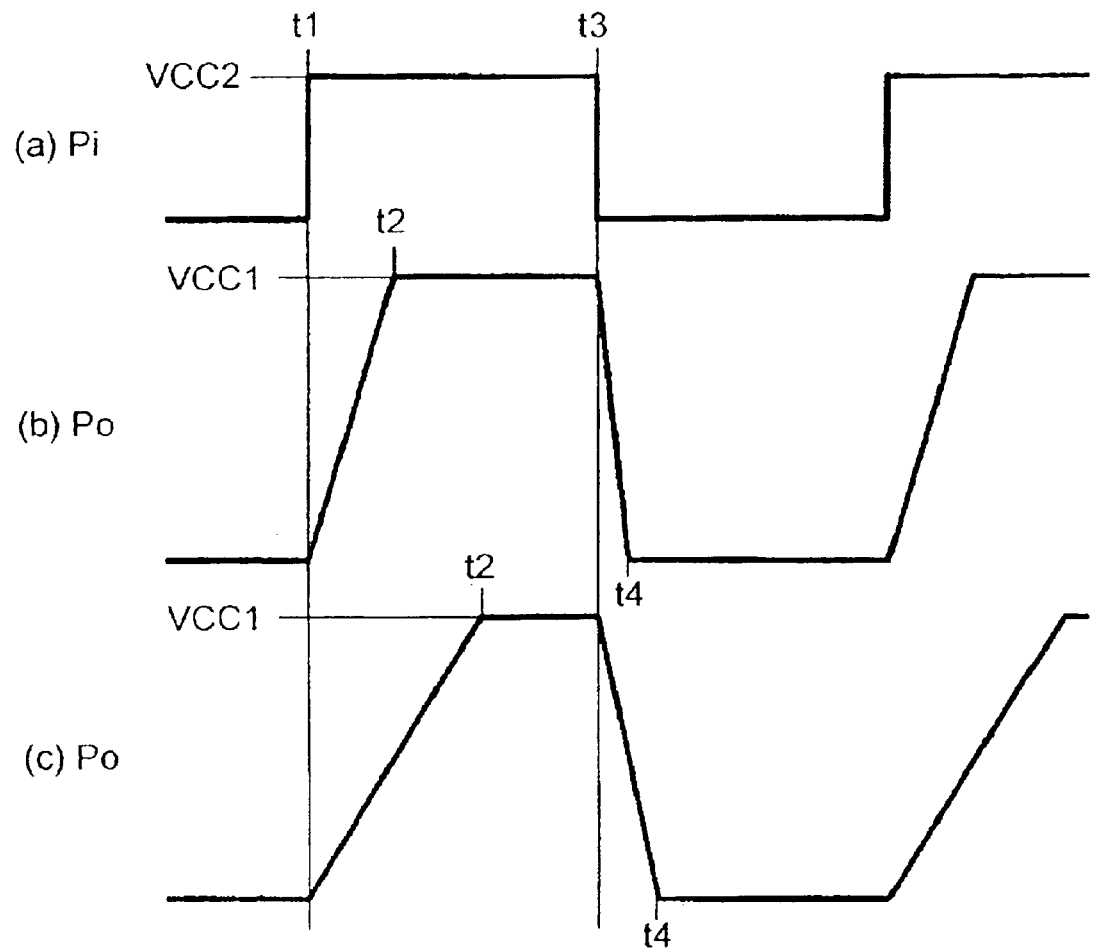
FIG. 5 is a time chart for explanation of the operation of the input circuit shown in FIG. 4.

FIG. 2(c) shows the waveform of the output signal Po for explanation of the operation of the input circuit in the case where the current driving capabilities of the respective transistors shown in FIG. 1 are decreased. The level transition time from t1 to t3 and tat from t4 to t6 of the output signal Po become somewhat longer, but can be reduced to a great extent compared to the waveform of the output signal Po shown in FIG. 5(c) and the duty variations of the input signal Pi and the input signal Ni can be minimized. Accordingly, it is possible to obtain a high-quality output signal which faithfully reproduces input signals which are inverted with respect to each other, and it is also possible to accept higher-speed input signals than those in the construction shown in FIG. 4. In addition, it is possible to restrain power consumption to a minute level of approximately 1 μW during the established state of the output signal level, whereby the input circuit can be suitably used in, for example, a display panel which is required to have a power saving feature.

Figure 3:
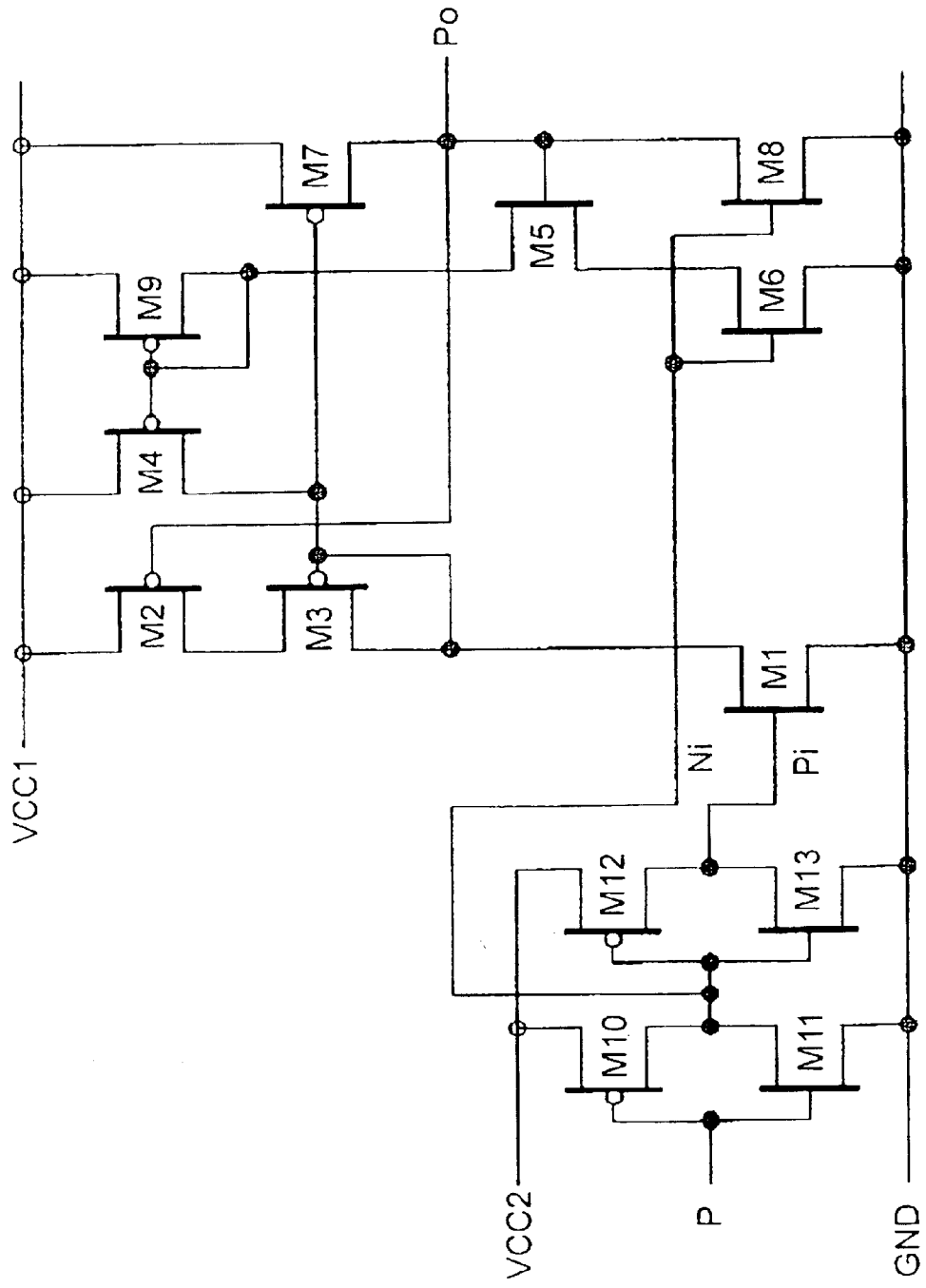
FIG. 3 is a circuit diagram showing an embodiment of an input circuit according to the invention.
Figure 6:
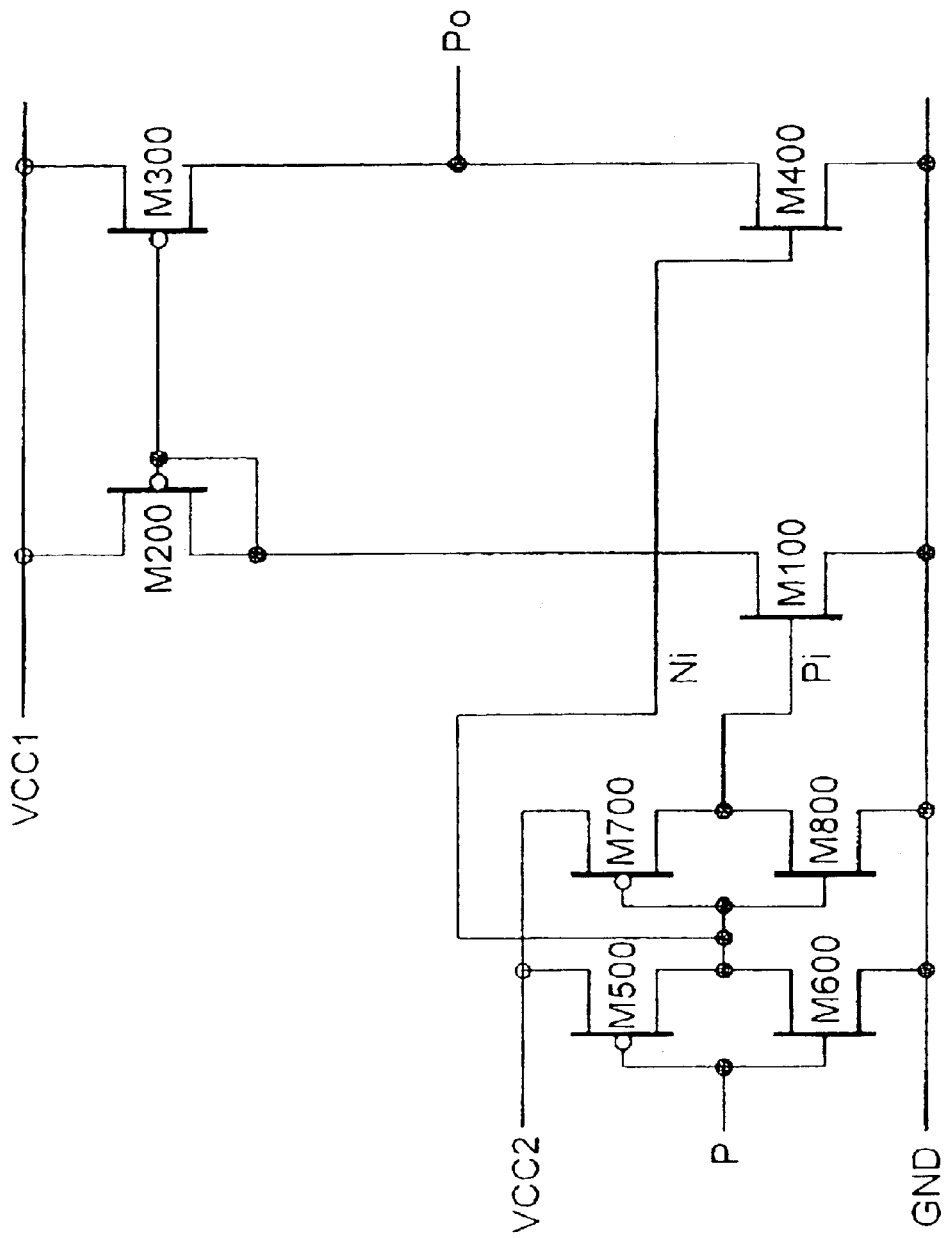
FIG. 6 is a circuit diagram of a related-art input circuit.

FIG. 3 shows an example of an input circuit which copes with one input signal P similarly to the input circuit shown in FIG. 6, and an input buffer circuit, which is formed by transistors M10 to M13 each operating at the source voltage VCC2 and outputs the signals Pi and Ni which are inverted with respect to each other, is connected to the input circuit. Even in the form shown in FIG. 3, a great reduction in power consumption and an improvement in high-speed operation can be expected compared to the construction shown in FIG. 6.

Figure 18:
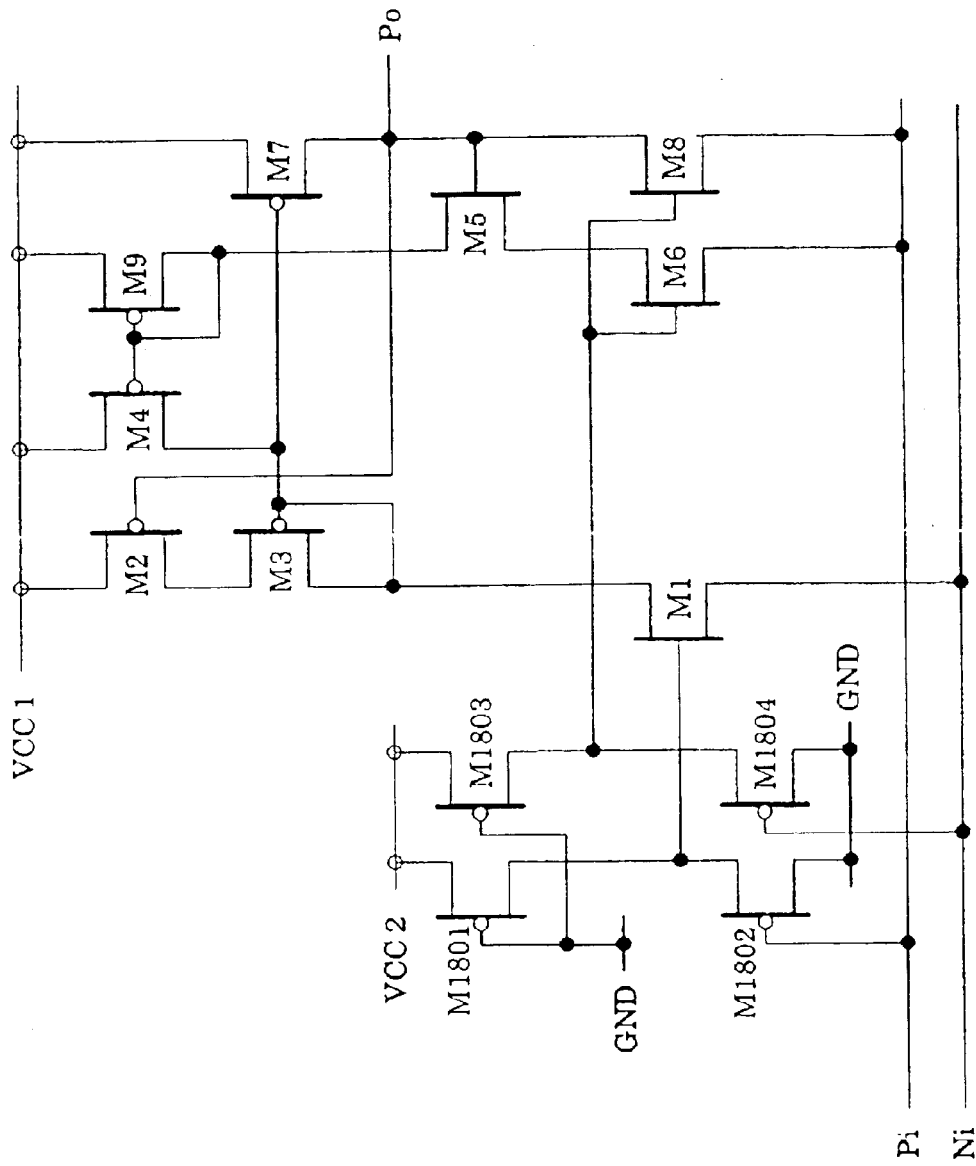
FIG. 18 is a view for explanation of an embodiment.

FIG. 18 shows an embodiment of an input circuit using the invention, and the input circuit receives at its input the signals Pi and Ni which are inverted with respect to each other and each of which have an input level equal to the low voltage VCC2 and outputs the output signal Po having an output level equal to the high voltage VCC1. The input signals Pi and Ni are respectively connected to a gate of a transistor M1802 and a gate of a transistor M1804, and the transistor M1802 and a transistor M1801 as well as the transistor M1804 and a transistor M1803 constitute source followers. Since the transistors M1801 and M1803 operate as current sources, their respective gate voltages are led to GND, and the gate W/L of each of the transistors M1801 and M1803 is appropriately set so that their current value can be made to be a desired value. In addition, the input signal Pi is connected to the source M6/S and the source M8/S, while the input signal Ni is connected to the source M1/S. An output terminal M1802/S of one of the above-described source followers is connected to the gate M1/G, while an output terminal M1804/S of another of the above-described source followers is connected to the gate M6/G and the gate M8/G. The drain M1/D is connected to the transistor M3 whose gate and drain are shorted together, and the gate M3/G is connected to the gate of the transistor M7 whose source is connected to the source voltage VCC1. The source M3/S is connected to the drain of the transistor M2 whose source is connected to the source voltage VCC1, and the gate M2/G is connected to the drain M7/D. The drain M6/D is connected to the source M5/S, and the gate M5/G is connected to the drain M7/D. The drain M5/D is connected to the transistor M9 whose source is connected to the source voltage VCC1 and whose gate and drain are shorted together. The drain M9/D is connected to the gate of the transistor M4 whose source is connected to the source voltage VCC1, and the drain M4/D is connected tote gate M7/G. The drain M8/D is connected to the drain M7/D and outputs the output signal Po.

Figure 19:
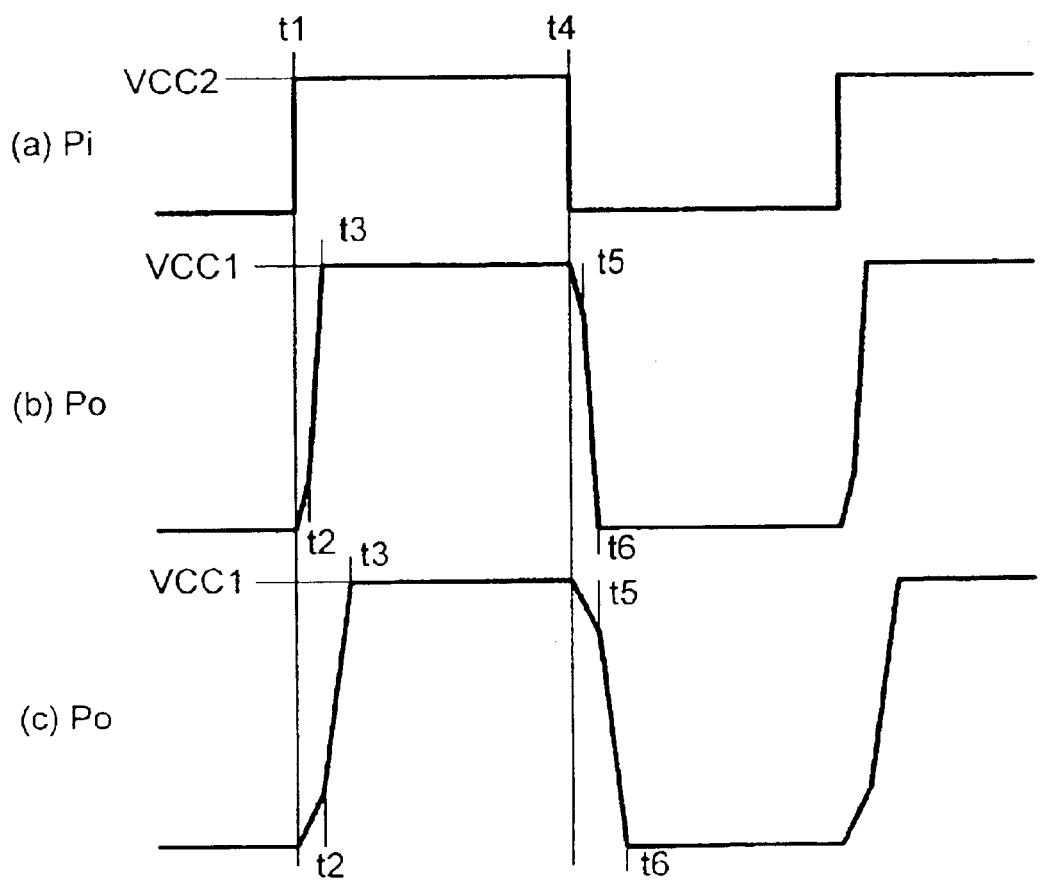
FIG. 19 is a view for explanation of an embodiment.

FIG. 19 is a time chart for explanation of the operation of the input circuit shown in FIG. 18.

(Before Time t1)

If the input level of each of the input signals Pi and Ni is Vi, the input signal Pi (Ni) is at the L (H) level, so that $Vgs\ (M1)=Vgs(M1802)-Vi,$ $Vgs\ (M6)=Vi+Vgs\ (M1804),$ and $Vgs\ (M8)=Vi+Vgs\ (M1804).$ When the threshold Vth of each of the transistors used in the input circuit shown in FIG. 18 is 3.0 V and the input level Vi is 3.0 V, the transistor M1 is turned off even if the current driving voltage ΔV of the transistor M1802 from the current source M1801 is present.

Contrarily, since the transistors M6 and M8 can use the input level Vi as the current driving voltage ΔV, the transistors M6 and M8 are turned on.

If it is assumed here that the output signal Po is at the L level, the transistor M2 is on and the transistor M5 is off, so that the transistor M5 is turned off by a current mirror operation relative to the transistor M1803. Accordingly, the L level of the output signal Po is established. Then, if it is assumed that the output signal Po is at the H level, the transistor M5 is on, and the gate M5/G is raised to the source voltage VCC1 by the current mirror circuit formed by the transistors M9 and M4 and the transistor M5 is turned off. The voltage of the output signal Po sharply changes from the H (VCC1) level to the L (GND) level, and is established at the L (GND) level.

Accordingly, when the input signal Pi is at the L level, the output signal Po is always at the L level. In addition, the voltage Vds between the drain and the source of each of the transistors M1, M6 and M8 which are on when the output signal Po is at the L level disappears, so that the transistors M1, M6 and M8 completely lose their current driving capabilities.

Even if there is a difference between the thresholds Vth of the transistors M9 and M4 of the current mirror circuit and the transistor M4 is in the current driving state, the drain M4/D goes to the level of the source voltage VCC1, so that the transistor M1804 also loses its current driving capability. At this time, in the current mirror circuit formed by the transistors M3 and M7, the current driving capability of the transistor M7 is minute. This is because even if the threshold voltage error ΔVth is large like in a TFT circuit, approximately 100 nA needs only to be estimated as the M7/D current (although the M7/D current depends on the size of the transistor).

Accordingly, when the input signal Pi is at the L level, if the source voltage VCC1 is 10 V in the input circuit shown in FIG. 1, power consumption due to the M7/D current is negligibly small at about as low as 1 μW.

From Time t1 to Time t4

If the input level of the input signal Pi changes to the H level at time t1, $Vgs\ (M1)=Vi+Vgs\ (M1802),$ $Vgs\ (M6)=Vgs\ (M1804)-Vi,$ and $Vgs\ (M8)=Vgs\ (M1804)-Vi.$ Accordingly, since the transistor M1 has the current driving voltage ΔV equal to the input level Vi, the transistor M1 changes to the on level. In the meantime, each of the transistors M6 and M8 positively lose the current driving voltage ΔV, and change to the off level. Accordingly, the output signal Po becomes unable to be held at the L level.

At this time, since the output signal Po is at the L level, the transistor M2 is on and the driving current of the transistor M1 is supplied to the transistor M3, and the voltage of the gate M3/G decreases and the transistor M7 starts current driving. Although the voltage decrease of the gate M3/G is not rapid, the voltage of the output signal Po increases.

Since the voltage increase of the output signal Po decreases the current driving capability of the transistor M2, the M2/D voltage decreases. Accordingly, a position feedback operation takes place in which the M3/G voltage also decreases and the current driving capability of the transistor M7 increases and the voltage of the output signal Po increases to a further extent. Accordingly, the transistor M2 loses the current driving capability and the drain M3/D (or the gate M3/G) rapidly changes to the L (or GND) level. At this time t2, since the transistor M7 gains the maximum current driving capability, the voltage of the output signal Po increases at the maximum speed, and is established at the H (VCC1) level at time t3. This state continues until time t4 until which the input signal Pi is at the H level.

During the period from time t3 to time t4, the transistor M5 is on. However, since no current is supplied to the transistor M5 from the transistor M6, the M4/D current is a minute current in the current mirror circuit formed by the transistors M4 and M9. This is because even if the threshold voltage error ΔVth is large like in a TFT circuit, approximately 100 nA needs only to be estimated as the M4/D current (although the M4/D current depends on the size of the transistor). Namely, if the source voltage VCC1 is 10 V, power consumption due to the M4/D current is negligibly small at about as low as 1 μW.

From Time t4 to Time t6

If the input level of the input signal Pi again changes to the L level at time t4, $Vgs\ (M1)=Vgs\ (M1802)-Vi,$ $Vgs\ (M6)=Vi+Vgs\ (M1804),$ and $Vgs\ (M8)=Vi+Vgs\ (M1804).$ The transistor M1 is again turned off, and the transistors M6 and M8 are again turned on. At this time, since the output signal Po is at the H level, the transistor M2 remains off, but the transistor M5 is on and the voltage of the gate M9/G (the drain M9/D) decreases. The transistor M4 goes to the current driving state, and the transistor M7 loses the current driving capability and the voltage of the output signal Po (the gate M2/G) starts to decrease.

At time t5, the transistor M2 is also turned on to increase the M7/G voltage, and the transistor M7 loses the current driving capability to a further extent. When the output signal Po goes to the L (GND) level, the transistor M4 loses the voltage Vds of itself and loses the current driving capability, and since the transistor M5 is turned off, the transistor M6 loses the voltage Vds of itself and loses the current driving capability. Then, the transistor M4 of the current mirror circuit formed by the transistors M4 and M9 also loses the current driving capability or the current driving capability of the transistor M4 goes to an extremely minute state.

Since the transistor M8 performs current driving during only the period from time t4 to time t6, the gate width W of the transistor M8 may be enlarged to increase the current driving capability irrespective of current consumption so that the transition time from t4 to t6 can be reduced.

In the above-described operation of the input circuit shown in FIG. 18, the transistors M2 and M5 each of which performs a switching operation is not limited to being controlled by the output signal Po, and may also be controlled by a signal formed by the output signal Po being passed through a buffer circuit.

FIG. 19(c) shows the waveform of the output signal Po for explanation of the operation of the input circuit in the case where the current driving capabilities of the respective transistors shown in FIG. 18 are decreased. The level transition time from t1 to t3 and that from t4 to t6 of the output signal Po become somewhat longer, but can be reduced to a great extent compared to the waveform of the output signal Po shown in FIG. 5(c) and the duty variations of the input signal Pi and the input signal Ni can be minimized. Accordingly, it is possible to accept higher-speed input signals than those in the construction shown in FIG. 4. In addition, it is possible to restrain power consumption to a minute level of approximately 1 $\mu$W during the established state of the output signal level, whereby the input circuit can be suitably used in, for example, a display panel which is required to have a power saving feature.

The input signals Pi and Ni shown in FIG. 18 have been explained as signals which are inverted with respect to each other, but either one of the input signals Pi and Ni may also be set to approximately the central voltage (Vi/2) of the input level Vi.

For example, if the signal Pi is at the input level Vi and the signal Ni is at a voltage of Vi/2, when the signal Pi is at the L level, $Vgs\ (M1)=Vgs\ (M1802)-Vi/2,$ $Vgs\ (M6)=Vi/2+Vgs\ (M1804),$ and $Vgs\ (M8)=Vi/2+Vgs\ (M1804).$ Accordingly, the transistor M1 is turned off, and the transistors M10 and M13 are turned on.

For example, when the signal Pi is at the H level, $Vgs\ (M1)=Vi+Vgs\ (M1802)-Vi/2=Vi/2+Vgs\ (M1802),$ $Vgs\ (M6)=Vi/2+Vgs\ (M1804)-V=Vgs\ (M1804)-Vi/2,$ and $Vgs\ (M8)=Vi/2+Vgs\ (M1804)-Vi=Vgs\ (M1804)-Vi/2.$ Accordingly, M1 is turned on, and M10 and M13 are turned off.

Therefore, the input circuit shown in FIG. 18 is capable of operating.

In FIG. 18, the input signals Pi and Ni are respectively connected to the source followers M1802, M1801 and M1804, M1803, but each of the transistors M1802 and M1804 which are respectively connected to the current sources M1801 and M1803 may also have a P or N type construction whose drain and gate terminals are shorted together. In addition, the current sources M1801 and M1803 are not limited to the construction shown in FIG. 18, and may have any construction that can generate the desired current.

A display panel to which the invention can be suitably applied will be described below. By way of example, the following description refers to an active matrix driving type of EL panel using a current-controlled type of luminescent element such as an organic EL element which has recently attracted attention. Such an EL element is applied to, for example, a panel-type image display system (EL panel) in which pixel circuits made of TFTs are two-dimensionally arranged. A voltage setting method and a current setting method are widely used as luminescence setting methods for this EL element.

<EL Panel Using Voltage Setting Method>

Figure 14:
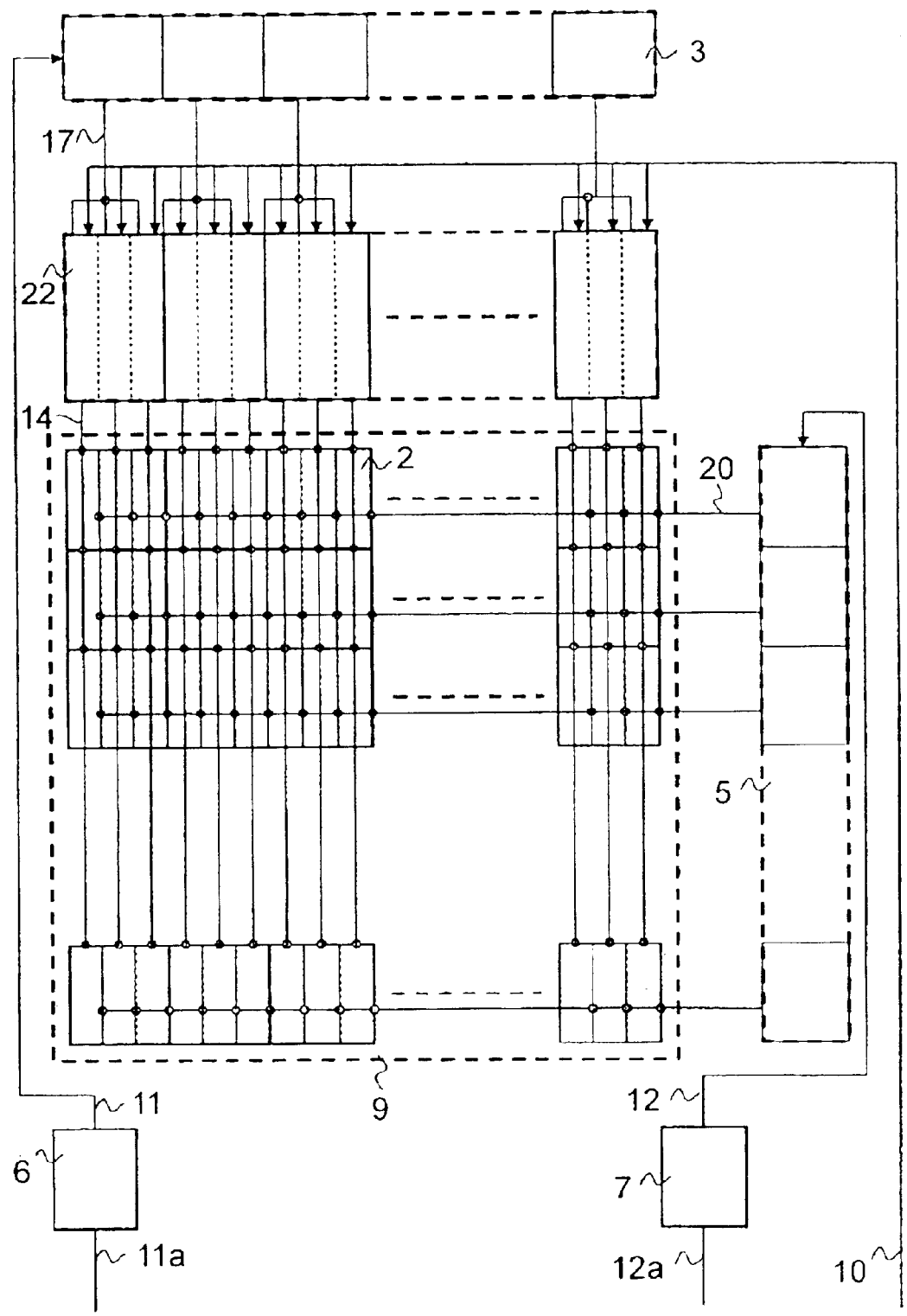
FIG. 14 is a circuit diagram of the entire circuit of an EL panel using a voltage setting method.

The circuit construction of a color EL panel using a voltage setting method is shown in FIG. 14.

Input video information 10 is inputted to appropriate ones of column control circuits 22. The column control circuits 22 are provided for each of R, G and B, that is to say, by a number which is three times the number of horizontal pixels of the EL panel. A horizontal scanning control signal 11a is inputted to an input circuit 6. A horizontal scanning control signal 11 outputted from the input circuit 6 is inputted to a horizontal shift register 3. The horizontal shift register 3 is made of registers that are equal in number to the horizontal pixels of the EL panel. The horizontal scanning control signal 11 is made of a horizontal clock signal and a horizontal scanning start signal. Horizontal sampling signals 17 outputted from the respective terminals of the horizontal shift register 3 are inputted to the corresponding ones of the column control circuits 22.

Figure 16:
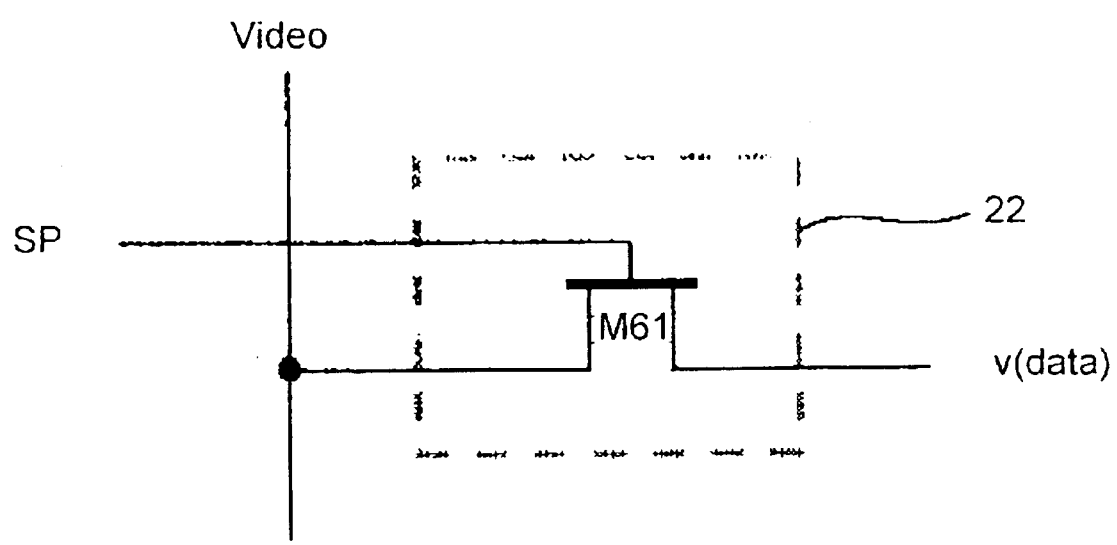
FIG. 16 is a circuit diagram of a column control circuit using the voltage setting method.

The construction of each of the column control circuits 22 is very simple. As shown in FIG. 16, a horizontal sampling signal SP is connected to a gate of a transistor M61, an input video signal Video (one of RGB colors) is connected to the source M61/S, and video voltage data v(data) which is a column control signal 14 is outputted from the drain M61/D.

In an image display area 9, a plurality of pixel circuits 2 each having an equivalent construction are two-dimensionally arranged. Each of the pixel circuits 2 is responsible for driving any one of R, G and B EL display elements, and a set of three pixel circuits 2 is responsible for the display of one pixel.

The video voltage data v(data) outputted from each of the column control circuits 22 is inputted to the pixel circuits 2 arranged in the same column. In addition, a vertical scanning control signal 12a is inputted to an input circuit 7, and a vertical scanning control signal 12 outputted from the input circuit 7 is inputted to a vertical shift register 5. The vertical shift register 5 includes registers that are equal in number to the vertical pixels of the EL panel. This vertical scanning control signal 12 is made of a vertical clock signal and a vertical scanning start signal. A row control signal 20 outputted from each output terminal of the vertical shift register 5 is inputted to the pixel circuits 2 arranged in the same row.

Pixel Circuit Using Voltage Setting Method

Figure 15:
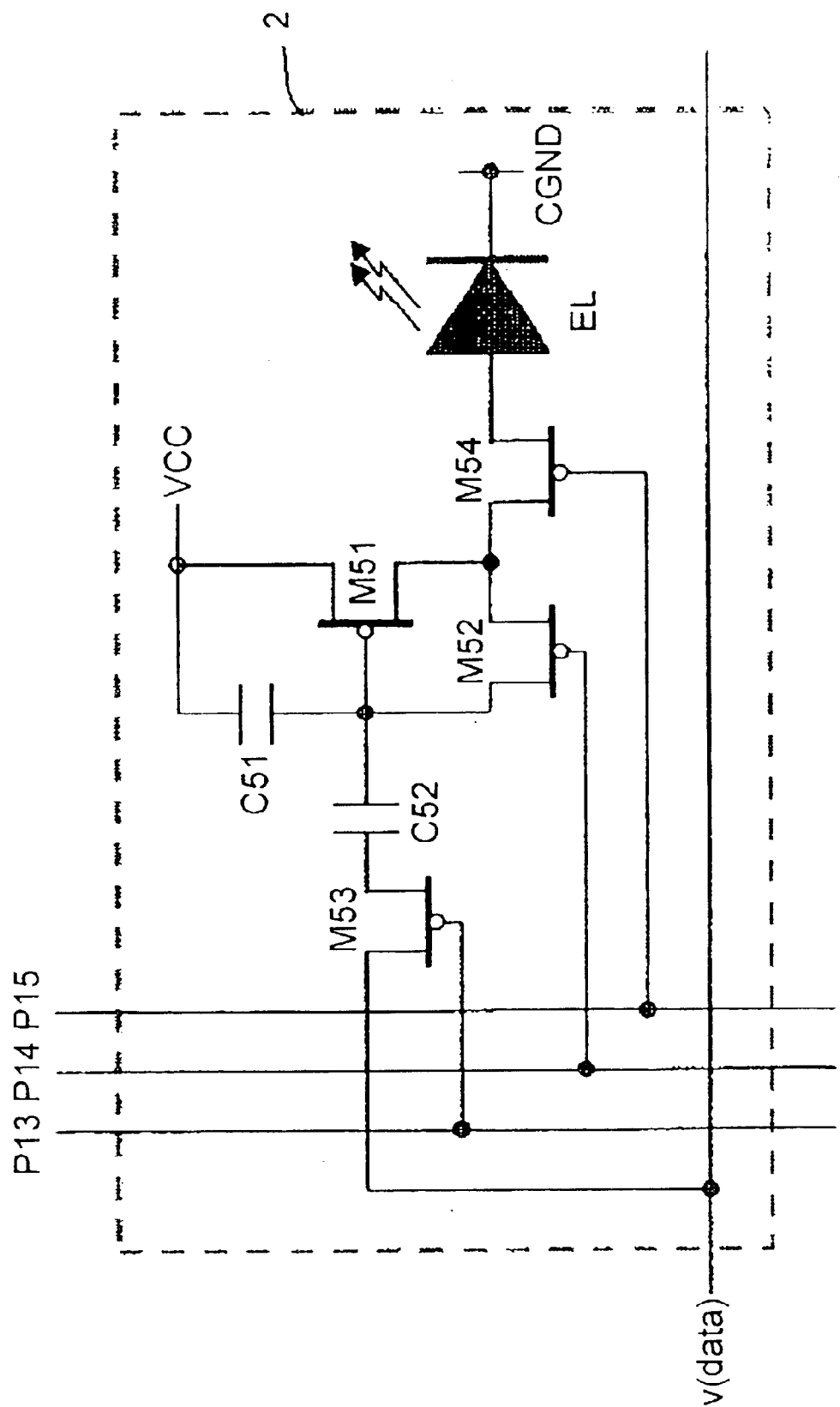
FIG. 15 is a circuit diagram of a pixel circuit using the voltage setting method.

The construction of one of the pixel circuits 2 using the voltage setting method is shown in FIG. 15. The video voltage data v(data) is connected to a source of a transistor M53. The row control signals 20 correspond to P13, P14 and P15 which are respectively connected to the gate M53/G and gates of transistors M52 and M54. The drain M53/D is connected to a capacitor C52, and the capacitor C52 is connected to a capacitor C51 and a gate of a transistor M51 whose source is connected to a power source. The drain M51/D and the gate M51/G are respectively connected to the drain M52/D and the source M52/S, and the drain M51/D is connected to the source M54/S. The drain M54/D is connected to a current injection terminal of an EL element which is grounded at one terminal.

Figure 17:
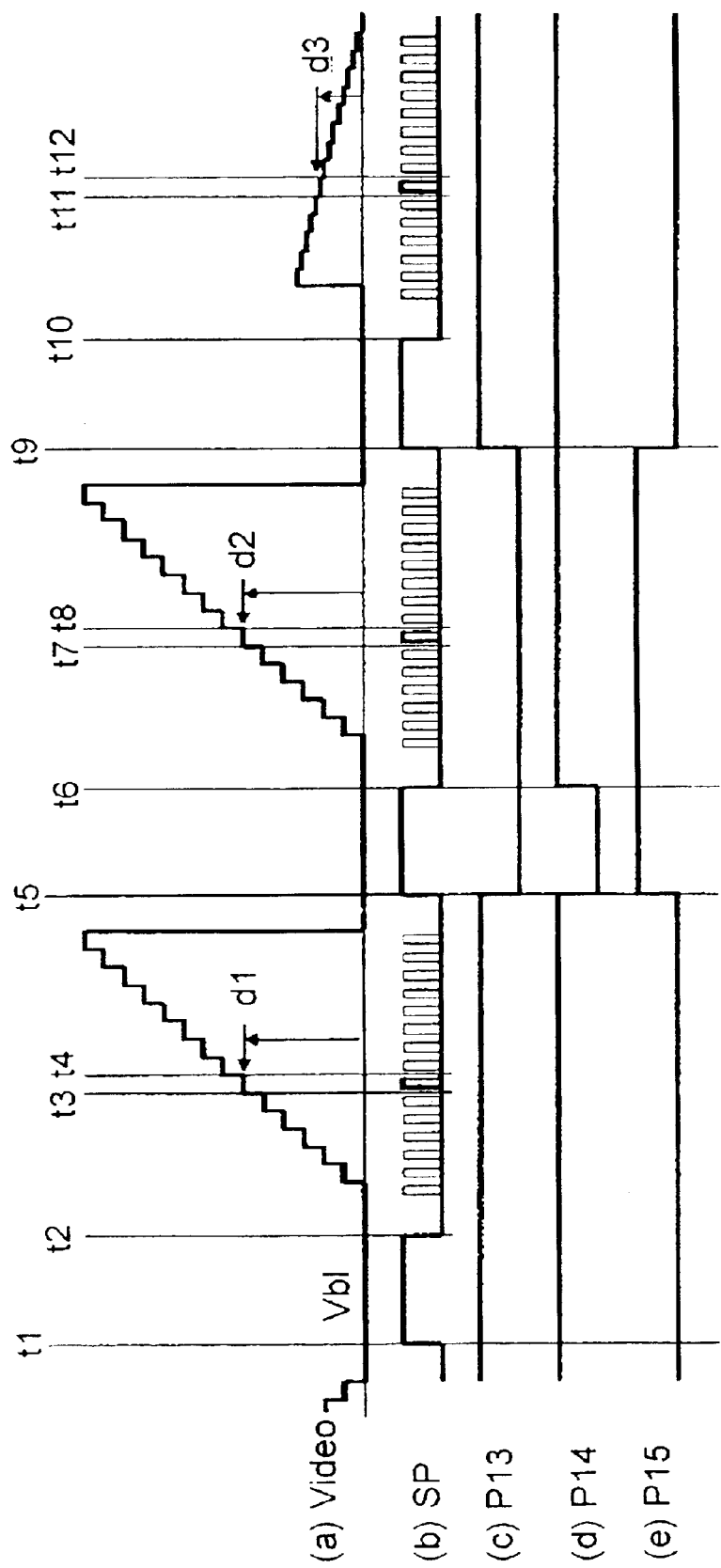
FIG. 17 is a time chart for explanation of the operation of the EL panel shown in FIG. 14.

The operation of the EL panel shown in FIG. 14 will be described below with reference to the time chart shown in FIG. 17. In FIG. 17, a waveform (a) shows the input video signal Video, a waveform (b) shows the horizontal sampling signal SP, and waveforms (c) to (e) show the row control signals P13 to P15 for the corresponding row. Incidentally, FIG. 17 shows three horizontal periods, that is to say, three row periods.

First, during the period from time t1 to time t2 within a horizontal blanking period of the input video signal, all horizontal sampling pulses SP are simultaneously changed to their H levels, and during this time a blanking voltage which is the input video signal is set to the column control signal 14. Incidentally, in the waveform (b) of FIG. 17, the horizontal sampling signal SP for the corresponding column is shown as a thick line.

Before Time t5 (Luminescence Holding Period)

During the period from time t1 to time t5, in the pixel circuit 2 for the corresponding row, the respective row control signals P13 to P15 are held at the H level, the H level and the L level. Therefore, during the period from time t1 to time t2, even when all horizontal sampling pulses SP simultaneously change to the H levels, the transistors M52, M53 and M54 of the pixel circuit 2 respectively remain off, off and on. Accordingly, the drain current of the transistor M51 that is determined by the capacitor C51 and the M51/G voltage of the corresponding pixel circuit 2 which is the holding voltage of the gate capacitance of the transistor M51 is injected into the corresponding EL element, and the EL element continues its luminescence. Incidentally, during the period from time t1 to time t2 within the horizontal blanking period, the voltage of the input video signal Video is a voltage Vb1 near a black level as shown in FIG. 17.

From Time t5 to Time t9 (Luminescence Setting Period)

At time t5, the row control signals P13 and P15 for the corresponding row respectively change to the L level and the H level. During the period from time t5 to time t6, all horizontal sampling pulses SP are again simultaneously changed to the H levels, and during this time a blanking voltage which is the input video signal is set to the column control signal 14.

During this time, in the pixel circuit 2 for the corresponding row shown in FIG. 15, the transistor M54 is turned off to stop supplying current to the EL element, whereby the EL element is turned off. In addition, since each of the transistors M52 and M53 is placed in the on state, the capacitors C51 and C52 as well as the gate capacitance of M51 perform their discharge operations so that a (VCC−M51/G) voltage progressively approaches the threshold voltage Vth of the transistor M51. Accordingly, the drain current of the transistor M51 is reset to a very small value. Incidentally, during the period from time t5 to time t6 within the horizontal blanking period, the voltage of the input video signal Video is the voltage Vb1 near the black level as shown in FIG. 17, similarly to that during the period from time t1 to time t2.

At time t6, the respective signals SP and P14 go to the L level and the H level, but the (VCC−M51/G) voltage of the pixel circuit 2 continues to be the threshold Vth of the transistor M51.

During the period from time t7 to time t8, the signal SP for the corresponding column goes to the H level, and an input video signal value d2 obtained at this time is inputted to the pixel circuit 2 as the video voltage data v(data). At this time, the M51/G voltage of the pixel circuit 2 changes by the voltage ΔV. The voltage ΔV is approximately expressed by Equation (1):

$$\Delta V = -d2 \times C52 - (C52 + C51 + C(M51)), \tag{1}$$

where C (M51) represents the gate input capacitance of the transistor M51 in the pixel circuit 2.

At time t8, the signal SP again changes to the L level and the change of the M51/G voltage expressed by Equation (1) is held, and this state is held until time t9.

(From Time t9 to Time t12 (Luminescence Holding Period))

At time t9, the respective row control signals P13 and P15 change to the H level and the L level, and the transistors M53 and M54 of the pixel circuit 2 respectively go to the off state and the on state. The drain current of the transistor M51 that is determined by the M51/G voltage of the corresponding pixel circuit that has changed in this manner is injected into the corresponding EL element, and a variation occurs in the amount of luminescence and this state is held.

During the periods from time t9 to time t10 and from time t11 to time t12, the signal SP changes to the H level, but since the transistor M53 of the pixel circuit 2 is off, the luminescent operation of the EL element is not influenced.

Equation (1) means that the amount of luminescence can be set by a voltage value (d2) based on the voltage Vb1 appearing during the horizontal blanking period of the input video signal Video. The drain current Id of the transistor M51 of the pixel circuit 2 can be approximately expressed by Equation (2):

$$Id = \beta \times \Delta V2. \tag{2}$$

Since the EL element basically performs a luminescent operation proportionate to an injected current, it can be seen from Equation (2) that in the EL panel using the voltage setting method shown in FIG. 14, the amount of luminescence of the EL element of each pixel can be controlled with a value proportionate to the second power of the input video signal level based on the blanking voltage.

The EL panel using the voltage setting method has the advantage that the circuit construction of a liquid crystal panel having an established reputation can be used except for the pixel circuit 2.

In the above-described EL panel using the voltage setting method, the horizontal shift register 3 and the vertical shift register 5 are used. The numbers of DFFs (delay flip-flops) used as register circuits in the shift registers 3 and 5 are respectively equal to the number of horizontal pixels and the number of vertical pixels of the display panel. The construction shown in FIG. 14 which is the entire circuit of the display panel using the voltage setting method can be similarly applied to a liquid crystal panel, by modifying the construction of the pixel circuit 2 into that of a liquid crystal element.

<EL Panel Using Current Setting Method>

Figure 7:
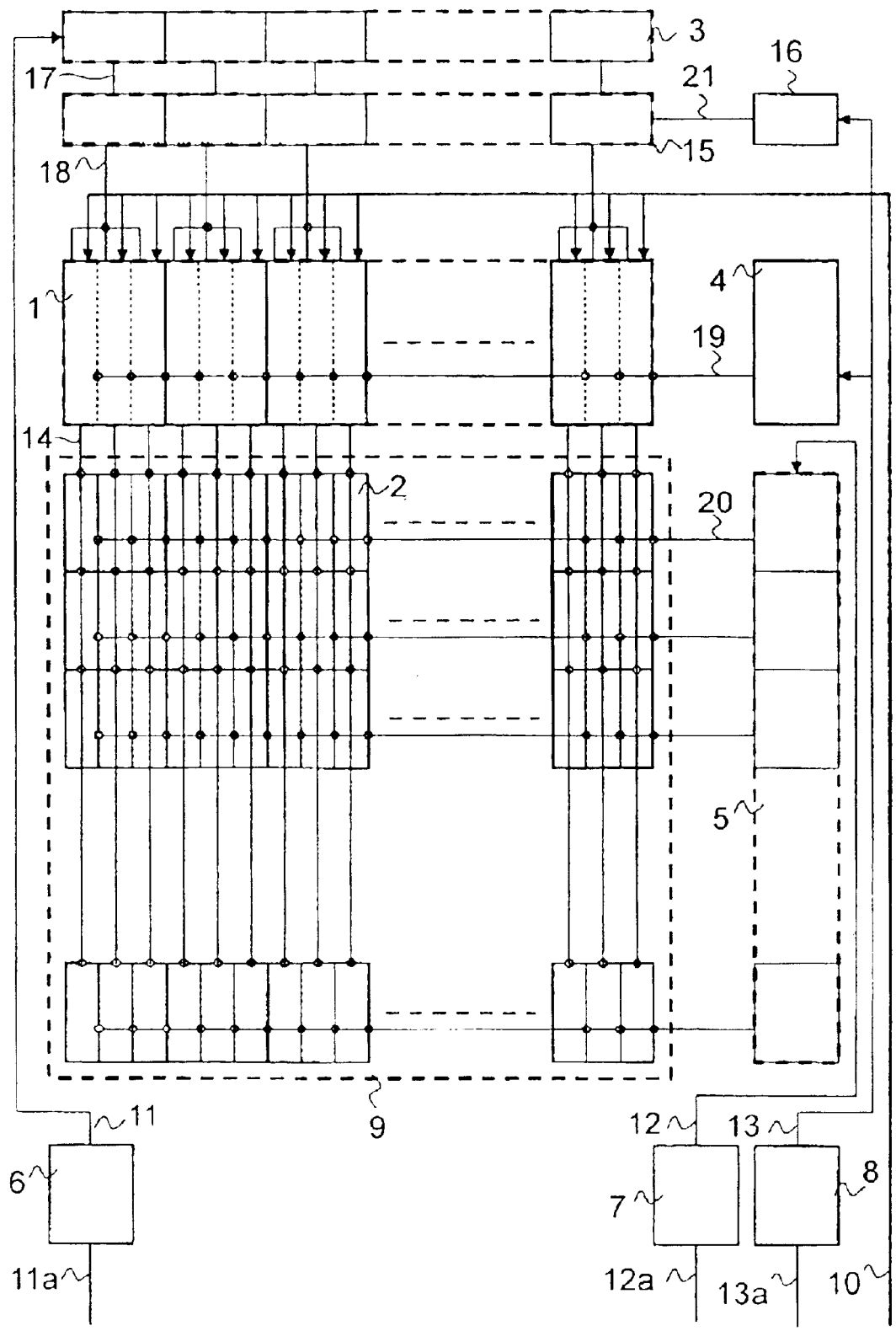
FIG. 7 is a circuit diagram of the entire circuit of an EL panel using a current setting method.

The circuit construction of a color EL panel using a current setting method is shown in FIG. 7. First of all, the difference between the EL panel shown in FIG. 7 and the EL panel using the voltage setting method shown in FIG. 14 will be described below.

An auxiliary column control signal 13a is inputted to an input circuit 8, and an auxiliary column control signal 13 outputted from the input circuit 8 is inputted to gate circuits 4 and 16. The horizontal sampling signals 17 outputted from the respective terminals of the horizontal shift register 3 are respectively inputted to gate circuits 15. Horizontal sampling signals 18 converted by the respective gate circuits 15 are inputted to column control circuits 1. A control signal 21 outputted from the gate circuit 16 is inputted to the gate circuits 15. A control signal 19 outputted from the gate circuit 4 is inputted to the column control circuits 1.

Column Control Circuit

Figure 10:
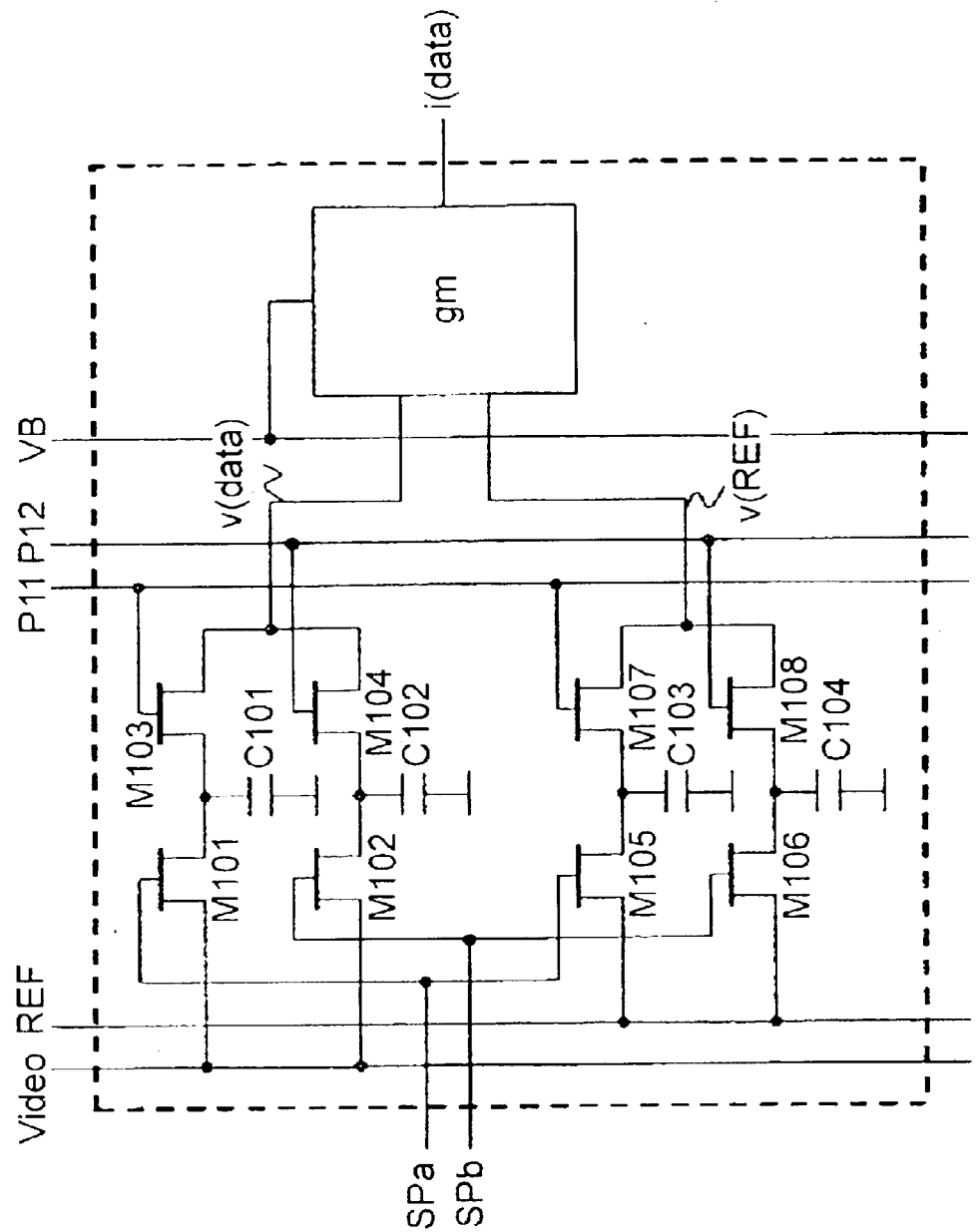
FIG. 10 is a circuit diagram of an EL element driving control circuit (column control circuit) using the current setting method.

The construction of one of the column control circuits 1 of the EL panel using the current setting method is shown in FIG. 10. The column control circuits 1 are disposed by the same number as the number of horizontal pixels of the EL panel.

Input video information is made of an input video signal Video and a reference signal REF, and the input video signal Video is inputted to sources of transistors M101 and M102, while the reference signal REF is inputted to sources of transistors M105 and M106. Each of the horizontal sampling signals 18 outputted from the gate circuits 15 is made of signals SPa and SPb. The signal SPa is connected to the gates M101/G and M105/G, while the signal SPb is connected to the gates M102/G and M106/G. Capacitors C101, C102, C103 and C104 are respectively connected to the drains M101/D, M102/D, M105/D and M106/D, and sources of transistors M103, M104, M107 and M108 are also respectively connected to the drains M101/D, M102/D, M105/D and M106/D. The control signal 19 is made of signals P11 and P12, and the signal P1 is connected to the gates M103/G and M107/G, while the signal P12 is connected to the gates M104/G and M108/G. The drains M103/D and M104/D are connected to each other and a voltage v (data) is inputted to a voltage-current conversion circuit gm, while the drains M107/D and M108/D are connected to each other and a voltage v(REF) is inputted to the voltage-current conversion circuit gm. In addition, a reference current setting bias VB is inputted to the voltage-current conversion circuit gm, and the voltage-current conversion circuit gm outputs a current signal i (data) to be used as the column control signal 14.

A construction example of the voltage-current conversion circuit gm is shown in FIG. 12(a). Although its basic operation is general and the description thereof is omitted, it is to be noted that if an EL panel designed to have a power saving function is, for example, a 200-ppi EL panel, the amount of current to be injected into the EL element of each pixel of this EL panel is assumed to be as small as a maximum of 100 nA which is greatly smaller than 1 $\mu$A. In order to obtain as linear a voltage-current conversion characteristic as possible under this condition, it is necessary to reduce the W/L ratio of the gate region of each of transistors M22 and M23 to reduce the current driving capabilities thereof.

FIG. 12(b) shows the voltage-current conversion characteristic of the circuit shown in FIG. 12(a). In the voltage-current conversion circuit shown in FIG. 12(a), it is difficult to adopt a design which causes a minimum current I1 (black current) relative to a minimum voltage V1 (black level) to become a zero current. If the black current I1 cannot be made to be a zero current, it becomes impossible to ensure contrast important to an image display panel.

A construction example of a voltage-current conversion circuit which copes with this point is shown in FIG. 13(a). Transistors M36 and M37 each of which has a grounded source and a drain and a gate shorted together are respectively connected to the drain terminals of transistors M32 and M33 of a first source-coupled circuit. In addition, the voltage-current conversion circuit is provided with M38 which has a source connected to a power source and a gate connected to the reference current bias VB and operates as a second reference current source, and a drain of a transistor M38 is connected to transistors M39 and M30 of a second source-coupled circuit. The gates M39/G and M30/G are respectively connected to the drains M37/D and M36/D. The current signal i (data) which becomes the column control signal 14 is outputted from the drain M30/D via the current mirror circuit of transistors M34 and M35 similarly to the voltage-current conversion circuit shown in FIG. 12(a).

In order to make the current driving capabilities of the transistors M36 and M37 smaller than those of the transistors M39 and M30 in the circuit shown in FIG. 13(a), the W/L ratio of the gate region of each of the transistors M36 and M37 is made smaller than the W/L ratio of the gate region of each of the transistors M39 and M30.

The voltage-current conversion characteristic of the voltage-current conversion circuit of FIG. 13(a) which is designed in this manner is shown in FIG. 13(b). As shown, it is possible to reduce the black current I1 relative to the black level V1, and it is possible to realize the linearity of the voltage-current conversion characteristic without impairing such linearity.

Figure 11:
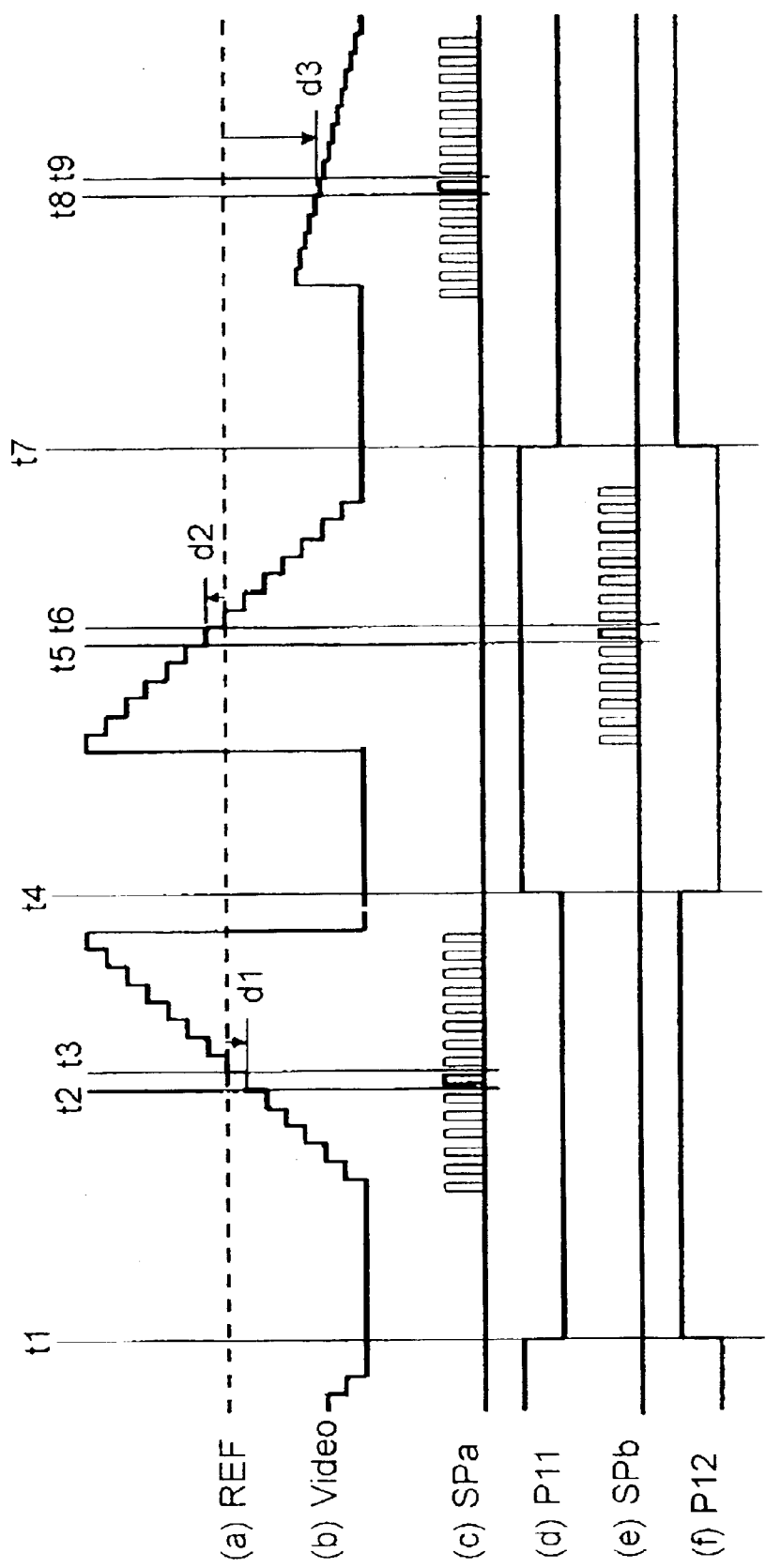
FIG. 11 is a time chart for explanation of the operation of the EL element driving control circuit shown in FIG. 10.

The operation of the column control circuit will be described below with reference to the time chart shown in FIG. 11.

At. time t1, the control signals P11 and P12 respectively change to the L level and the H level.

During the effective period of the input video signal from time t1 to time t4, horizontal sampling signals SPa are generated. During the period from time t2 to time t3, a horizontal sampling signal SPa for the corresponding column is generated, and the input video signal Video and the reference signal REF at this time are sampled in the capacitors C101 and C103 and are held after time t3 as well.

At time t4, the control signals P11 and P12 respectively change to the H level and the L level, and a voltage (v(data) v(REF)) to be inputted to the voltage-current conversion circuit becomes d1. The voltage-current conversion circuit outputs as the column control signal 14 the current signal i(data) obtained during the period from time t4 to time t7 on the basis of video information received during the period from time t2 to time t3.

During the effective period of the input video signal from time t4 to time t7, horizontal sampling signals SPb are generated. During the period from time t5 to time t6, a horizontal sampling signal SPb for the corresponding column is generated, and the input video signal Video and the reference signal REF at this time are sampled in the capacitors C102 and C104 and are held after time t6 as well.

At time t7, the control signals P11 and P12 respectively again change to the L level and the H level, and the voltage (v(data) −v(REF)) to be inputted to the voltage-current conversion circuit gm becomes d2. The voltage-current conversion circuit outputs the current signal i (data) for one horizontal scanning period after time t7 as the column control signal 14 on the basis of video information received during the period from time t5 to time t6.

During the effective period of the input video signal for one horizontal scanning period after time t7, horizontal sampling signals SPa are again generated. During the period from time t8 to time t9, a horizontal sampling signal SPa for the corresponding row is generated, and the input video signal Video and the reference signal REF at this time are sampled in the capacitors C102 and C104 and are held after time t9 as well.

The above-described operation is repeated, whereby the current signal i(data) which is the column control signal 14 is converted into a progressive signal which is updated every horizontal scanning period of the input video signal Video.

Pixel Circuit Using Current Setting Method

FIGS. 9(a) and 9(b) are views for explanation of a pixel circuit using the current setting method. FIG. 9(a) shows a pixel circuit using the current setting method, and FIG. 9(b) is a time chart for explanation of the operation of the pixel circuit shown in FIG. 9(a). Signals P9 and P10 correspond to the row control signals 20. The current signal i(data) is inputted as the column control signal 14. A drain of a transistor M91 is connected to the current injection terminal of a grounded EL element.

The operation of the pixel circuit will be described below with reference to the time chart shown in FIG. 9(b). Before time t0, since the signals P9 and P10 for the corresponding row (m) are at the H levels, both transistors M93 and M94 are off. Accordingly, a current is injected into the EL element by an M91/G voltage which is determined by charged voltages held in a capacitor C91 and the gate capacitance of the transistor M91, and the EL element is performing luminescence according to the injected current.

At time t0, both of the signals P9 and P10 for the corresponding row change to the L levels, and a current signal i (m) for the m-th row is established. Namely, both the transistors M93 and M94 are turned on, and the current signal i (m) is supplied to the transistor M92. An M92/G voltage is set according to this current signal i(m), and the capacitor C91 and the gate capacitances of the transistors M91 and M92 are charged and a current corresponding to the current signal i (m) starts to be injected into the EL element.

At time t1 when the current signal i (m) is established, the signal P10 changes to the H level and the transistor M93 goes to the off state, and the operation of setting the M92/G voltage is completed and a holding operation starts. At time t2, the signal P9 also changes to the H level and the supply of current to the transistor M92 is stopped. However, since the M92/G voltage set by the current signal i (m) remains held, the EL element is again set by the injected current which continues to be again set, and continues luminescence.

FIGS. 8(a) and 8(b) are views for explanation of a pixel circuit using the current setting method. FIG. 8(a) shows a pixel circuit using the current setting method, and FIG. 8(b) is a time chart for explanation of the operation of the pixel circuit shown in FIG. 8(a). Signals P7 and P8 correspond to the row control signals 20. The current signal i(data) is inputted as the column control signal 14. A drain of a transistor M84 is connected to the current injection terminal of a grounded EL element.

The operation of the pixel circuit will be described below with reference to the time chart shown in FIG. 8(b). Before time t0, since the signals P7 and P8 for the corresponding row (m) are at the L level and the H level, respectively, both transistors M82 and M83 are off and the transistor M84 is on. Accordingly, a current is injected into the EL element by a gate voltage of a transistor M81 which is determined by charged voltages held in a capacitor C81 and the gate capacitance of the transistor M81, and the EL element is performing luminescence according to the injected current.

At time t0, both of the signals P7 and P8 for the corresponding row change to the H level and the L level, respectively, and the current signal i (m) for the m-th row is established. Since both the transistors M82 and M83 are turned on and the transistor M84 is turned off, the supply of current to the EL element for the corresponding row is stopped and the EL element for the corresponding row is turned off. In addition, since the current signal i (m) is supplied to M81, the M81/G voltage is set according to this current signal i (m), and the capacitor C81 and the gate capacitance of the transistor M81 are charged.

At time t1 when the current signal i (m) is established, the signal P8 again changes to the H level and the transistor M82 goes to the off state, and the operation of setting the M81/G voltage is completed and a holding operation Starts.

At time t2, the signal P7 changes to the L level and the supply of current to the transistor M81 is stopped, and the transistor M84 is turned on and the drain current of the transistor M81 which is set by the M81/G voltage is injected into the EL element. According to this injected current, the EL element starts luminescence which is again set before time t1, and continues this state until the drain current of the transistor M81 is again set.

Figure 20:
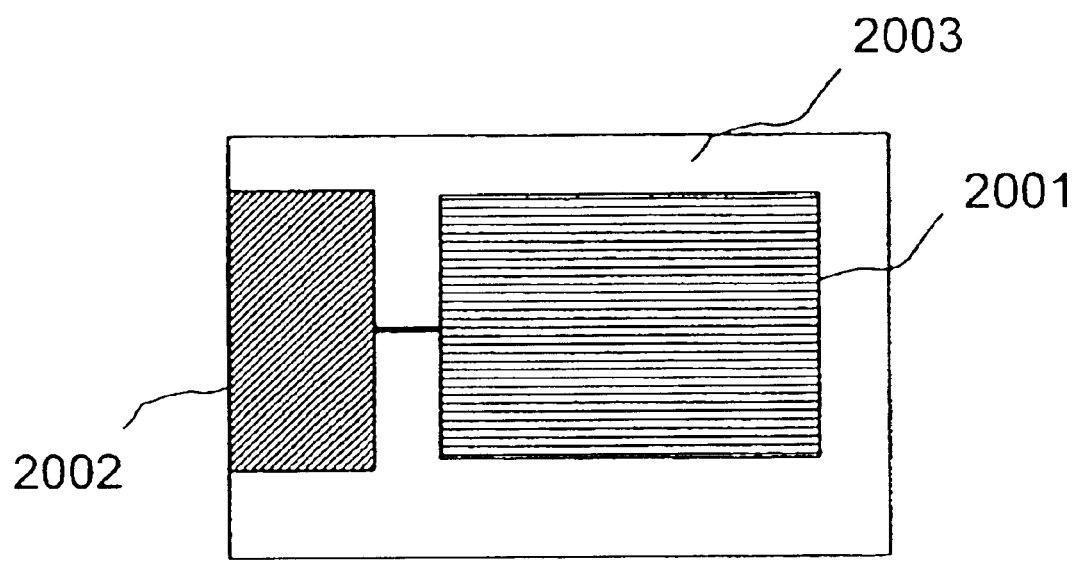
FIG. 20 is a view for explanation of the embodiments.

FIG. 20 is a view for explanation of the construction of an information display apparatus in which the EL panel explained in the aforementioned embodiment is used as a display device. This information display apparatus may take any form such as a mobile phone, a mobile computer, a still camera or a video camera, or may be an apparatus which realizes a plurality of functions from among these functions. A display device 2001 corresponds to the EL panel explained in the aforementioned embodiment. Reference numeral 2002 denotes an information input part. In the case of a mobile phone, the information input part includes an antenna. In the case of, for example, a PDA or a mobile personal computer, the information input part includes an interface part for networks. In the case of a still camera or a movie camera, the information input part includes a sensor part using a CCD, a CMOS or the like. Reference numeral 2003 denotes a body which holds the information input part 2002 and the display device 2001.

As is apparent from the foregoing description, in the case where the input circuit according to the invention is used, a great reduction in power consumption and a great improvement in high-speed operation are realized, whereby the input circuit can also be used very effectively and versatilely even in a circuit system which is required to operate at a high voltage compared to the level of an input signal. The input circuit is useful, particularly in a display panel whose input circuit is made of TFT elements.

What is claimed is:

1. An input circuit which receives first and second signals at its inputs and outputs an output signal having a level different from the first and second signals, comprising:

a first transistor whose output current is controlled by the level of the first signal;

second and third transistors whose output currents are controlled by the level of the second signal;

a first current mirror circuit which receives a current output of the first transistor at its input and includes a first switch;

a second switch which receives a current output of the second transistor at its input; and a second current mirror circuit which receives an output of the second switch at its input, wherein the first current mirror circuit performs its normal operation when the first switch is turned on, and is constructed so that a period during which the first current mirror circuit outputs a current occurs when the first switch is turned off, wherein the second current mirror circuit is connected to the first current mirror circuit so that the output current of the first current mirror circuit is decreased by an output current of the second current mirror circuit, wherein a current output of the third transistor and a current output of the first current mirror circuit are connected and outputted as the output signal, and wherein the first and second switches are controlled by the output signal or a signal formed by the output signal being passed through a buffer circuit.

2. An input circuit according to claim 1, further comprising a conversion circuit for converting the level of the first signal, the output current of the first transistor being controlled by a signal obtained by converting the level of the first signal.

3. An input circuit according to claim 1, further comprising a conversion circuit for converting the level of the second signal, the output currents of the second and third transistors being controlled by a signal obtained by converting the level of the second signal.

4. An input circuit according to claim 1, wherein the second signal is connected to one of the two electrodes of the first transistor other than a gate electrode thereof, the one electrode being an electrode different from an electrode through which the output current is outputted.

5. An input circuit according to claim 1, wherein the first signal is connected to one of two electrodes of the second transistor other than a gate electrode thereof, the one electrode being an electrode different from an electrode through which the output current is outputted.

6. An input circuit according to claim 1, wherein the first signal is connected to one of two electrodes of the third transistor other than a gate electrode thereof, the one electrode being an electrode different from an electrode through which the output current is outputted.

7. An input circuit according to claim 1, further comprising a circuit for generating the first signal and the second signal from one signal.

8. An input circuit according to claim 1, wherein the first signal and the second signal are signals which are inverted with respect to each other.

9. A display device comprising:

an input circuit according to claim 1; and a display element driven by the output signal of the input circuit.

10. An information display apparatus comprising:

an information input part to which information is to be inputted; and a display device according to claim 9, which provides visual display according to the information inputted to the information input part.

* * * * *

UNITED STATES PATENT AND TRADEMARK OFFICE
CERTIFICATE OF CORRECTION

PATENT NO. : 6,812,768 B2
DATED : November 2, 2004
INVENTOR(S) : Somei Kawasaki et al.

It is certified that error appears in the above-identified patent and that said Letters Patent is hereby corrected as shown below:

Column 7,
Line 44, "level" should read -- level. --.

Colomn 8,
Line 31, "to" should read -- the --.
Line 41, "tat" should read -- that --.

Signed and Sealed this

Tenth Day of May, 2005

JON W. DUDAS
*Director of the United States Patent and Trademark Office*